(12) United States Patent
Weng et al.

(10) Patent No.: US 12,088,271 B2
(45) Date of Patent: Sep. 10, 2024

(54) STRUCTURE AND MANUFACTURING METHOD OF SURFACE ACOUSTIC WAVE FILTER WITH BACK ELECTRODE OF PIEZOELECTRIC LAYER

(71) Applicant: Shenzhen Newsonic Technologies Co., Ltd., Shenzhen (CN)

(72) Inventors: Guojun Weng, Shenzhen (CN); Gongbin Tang, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 174 days.

(21) Appl. No.: 17/933,075

(22) Filed: Sep. 16, 2022

(65) Prior Publication Data

US 2023/0008048 A1  Jan. 12, 2023

(51) Int. Cl.
| | | |
|---|---|---|
| H01L 21/306 | (2006.01) | |
| C23C 14/06 | (2006.01) | |
| C23C 14/10 | (2006.01) | |
| C23C 14/48 | (2006.01) | |
| C23C 14/58 | (2006.01) | |

(Continued)

(52) U.S. Cl.
CPC ............ *H03H 3/08* (2013.01); *C23C 14/0641* (2013.01); *C23C 14/0652* (2013.01); *C23C 14/10* (2013.01); *C23C 14/48* (2013.01); *C23C 14/5873* (2013.01); *C23C 16/24* (2013.01); *C23C 16/34* (2013.01); *C23C 16/345* (2013.01); *C23C 16/401* (2013.01); *C23C 16/56* (2013.01)

(58) Field of Classification Search
None
See application file for complete search history.

(56) References Cited

U.S. PATENT DOCUMENTS

| | | | |
|---|---|---|---|
| 9,553,253 B2 * | 1/2017 | Iwamoto | H10N 30/08 |
| 11,777,472 B2 * | 10/2023 | Weng | H03H 9/13 |
| | | | 310/365 |

(Continued)

FOREIGN PATENT DOCUMENTS

CN    114884482 A    8/2022

OTHER PUBLICATIONS

The International Search Report and the Written Opinion of the International Searching Authority, issued by the International Searching Authority for International Application No. PCT/IB2023/059159 dated Jan. 29, 2024.

(Continued)

*Primary Examiner* — Shamim Ahmed
(74) *Attorney, Agent, or Firm* — Finnegan, Henderson, Farabow, Garrett & Dunner, LLP.

(57) ABSTRACT

A fabrication method of a surface acoustic wave (SAW) filter includes obtaining a piezoelectric substrate, forming a back electrode on a first portion of the piezoelectric substrate, forming a first dielectric layer on the first portion of the piezoelectric substrate, forming a trench in the first dielectric layer, forming a second dielectric layer on the first dielectric layer formed with the trench, forming a third dielectric layer on the second dielectric layer, removing a second portion of the piezoelectric substrate to obtain a piezoelectric layer, forming an interdigital transducer (IDT) on the piezoelectric layer, and etching and releasing a portion of the first dielectric layer surrounded by the trench to form a cavity below the back electrode.

18 Claims, 38 Drawing Sheets

(51) Int. Cl.
   *C23C 16/24*   (2006.01)
   *C23C 16/34*   (2006.01)
   *C23C 16/40*   (2006.01)
   *C23C 16/56*   (2006.01)
   *H03H 3/08*    (2006.01)

(56) References Cited

U.S. PATENT DOCUMENTS

| | | |
|---|---|---|
| 2012/0205754 A1 | 8/2012 | Iwamoto |
| 2013/0321100 A1 | 12/2013 | Wang |
| 2014/0130319 A1* | 5/2014 | Iwamoto ............... H03H 9/059 |
| | | 29/25.35 |
| 2019/0074813 A1 | 3/2019 | Zou et al. |
| 2019/0273116 A1* | 9/2019 | Goktepeli ............... H03H 9/64 |
| 2020/0259480 A1 | 8/2020 | Pensala et al. |
| 2021/0265978 A1* | 8/2021 | Plesski .................. H03H 3/02 |
| 2022/0103147 A1 | 3/2022 | Wang |
| 2023/0087523 A1 | 3/2023 | Weng |

OTHER PUBLICATIONS

Jan H. Kuypers et al., "Intrinsic temperature compensation of aluminum nitride lamb wave resonators for multiple-frequency references", Frequency Control Symposium, 2008 IEEE International, IEEE, Piscataway, NY, USA, May 19, 2008 (May 19, 2008), pp. 240-249.

* cited by examiner

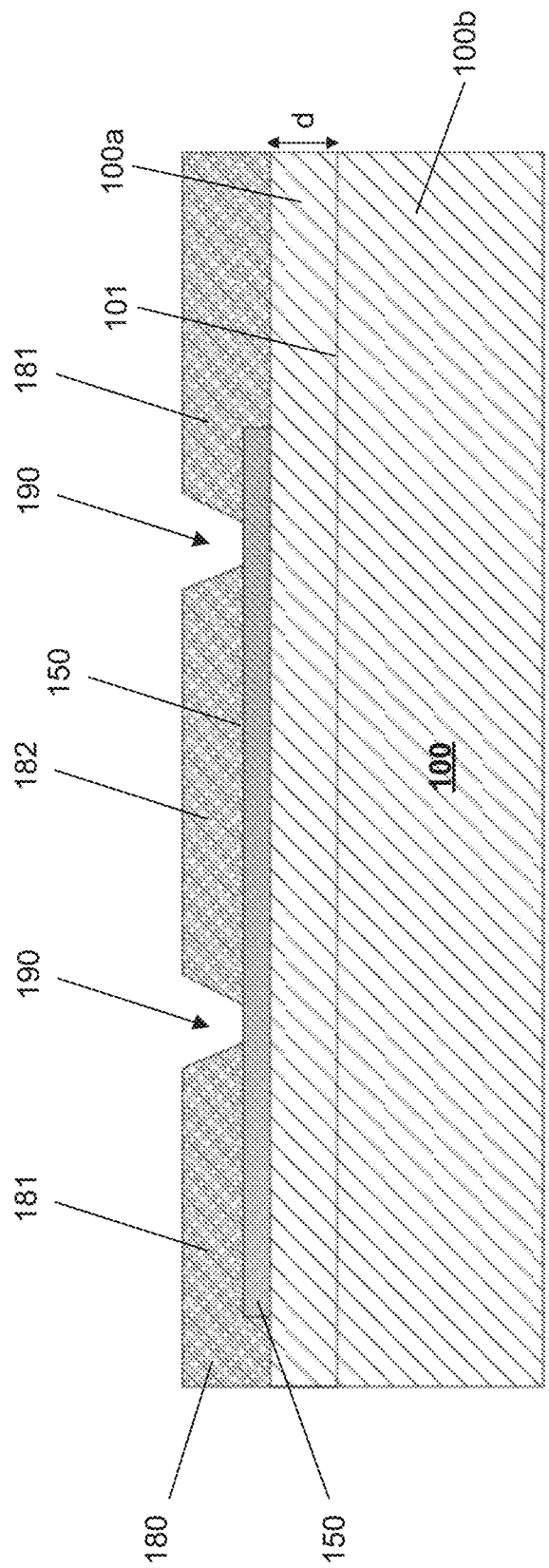

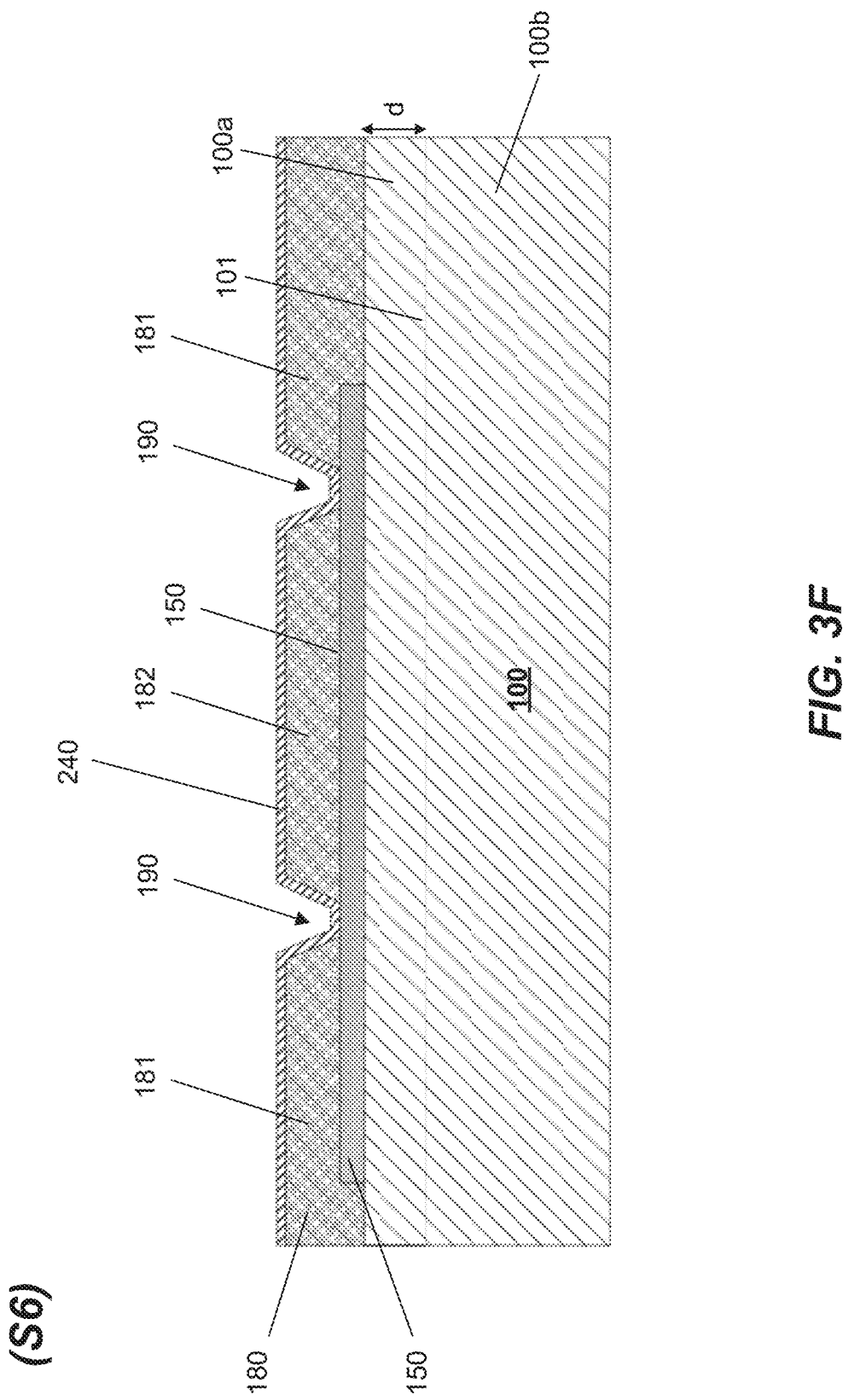

STRUCTURE AND MANUFACTURING METHOD OF SURFACE ACOUSTIC WAVE FILTER WITH BACK ELECTRODE OF PIEZOELECTRIC LAYER

FIELD OF THE DISCLOSURE

The present disclosure relates to the field of semiconductor devices and, in particular, to a surface acoustic wave (SAW) filter structure and a method of fabricating the SAW filter.

BACKGROUND

Surface acoustic wave (SAW) devices, such as SAW resonators and SAW filters, are used in many applications such as radio frequency (RF) filters. A typical SAW filter includes a plurality of interdigital transducers (IDTs) formed on a piezoelectric substrate. The plurality of IDTs are connected in series or in parallel.

As the use of SAW filters in modern RF communication systems increase, there is a need for SAW filters with improved quality factor (Q).

SUMMARY

According to one aspect of the disclosure, a surface acoustic wave (SAW) filter is provided. The SAW filter includes a bottom substrate, a piezoelectric layer disposed above the bottom substrate, the piezoelectric layer having a bottom surface facing the bottom substrate and a top surface opposite to the bottom surface, a cavity disposed below the piezoelectric layer, an interdigital transducer (IDT) disposed on the top surface of the piezoelectric layer, and a back electrode disposed on the bottom surface of the piezoelectric layer, at least a portion of the back electrode being exposed in the cavity.

According to another aspect of the disclosure, a SAW filter is provided. The SAW filter includes a bottom substrate, a piezoelectric layer disposed above the bottom substrate, the piezoelectric layer having a bottom surface facing the bottom substrate and a top surface opposite to the bottom surface, a cavity disposed below the piezoelectric layer, a back electrode disposed on the top surface of the piezoelectric layer, and an interdigital transducer (IDT) disposed on the bottom surface of the piezoelectric layer, an interdigital portion of the IDT being exposed in the cavity.

According to one aspect of the disclosure, a fabrication method of a surface acoustic wave (SAW) filter is provided. The method includes: obtaining a piezoelectric substrate, forming a back electrode on a first portion of the piezoelectric substrate, forming a first dielectric layer on the first portion of the piezoelectric substrate and covering the back electrode, forming a trench in the first dielectric layer and exposing a portion of the back electrode, the trench surrounding a portion of the first dielectric layer, forming a second dielectric layer on the first dielectric layer and covering sidewalls and a bottom of the trench, forming a third dielectric layer on the second dielectric layer, the third dielectric layer filling in the trench, bonding a bottom substrate to the third dielectric layer, removing a second portion of the piezoelectric substrate, and leaving the first portion of the piezoelectric substrate, the first portion of the piezoelectric substrate constituting a piezoelectric layer, forming an interdigital transducer (IDT) on the piezoelectric layer, and etching and releasing the portion of the first dielectric layer surrounded by the trench to form a cavity below the back electrode.

According to another aspect of the disclosure, a fabrication method of a surface acoustic wave (SAW) filter is provided. The method includes: obtaining a piezoelectric substrate, forming an interdigital transducer (IDT) on a first portion of the piezoelectric substrate, forming a first dielectric layer on the first portion of the piezoelectric substrate and covering the IDT, forming a trench in the first dielectric layer and exposing a portion of the first portion of the piezoelectric substrate, the trench surrounding a portion of the first dielectric layer that covers an interdigital portion of the IDT, forming a second dielectric layer on the first dielectric layer and covering sidewalls and a bottom of the trench, forming a third dielectric layer on the second dielectric layer, the third dielectric layer filling in the trench, bonding a bottom substrate to the third dielectric layer, removing a second portion of the piezoelectric substrate, and leaving the first portion of the piezoelectric substrate, the first portion of the piezoelectric substrate constituting a piezoelectric layer, forming a back electrode on the piezoelectric layer, and etching and releasing the portion of the first dielectric layer surrounded by the trench to form a cavity below the interdigital portion of the IDT.

BRIEF DESCRIPTION OF THE DRAWINGS

The accompanying drawings, which are incorporated in and constitute a part of this application, illustrate disclosed embodiments and, together with the description, serve to explain the disclosed embodiments.

FIGS. 3A-3M are cross-sectional views of structures formed in the process of FIG. 2, according to an embodiment of the present disclosure.

DETAILED DESCRIPTION

Figure 1A:
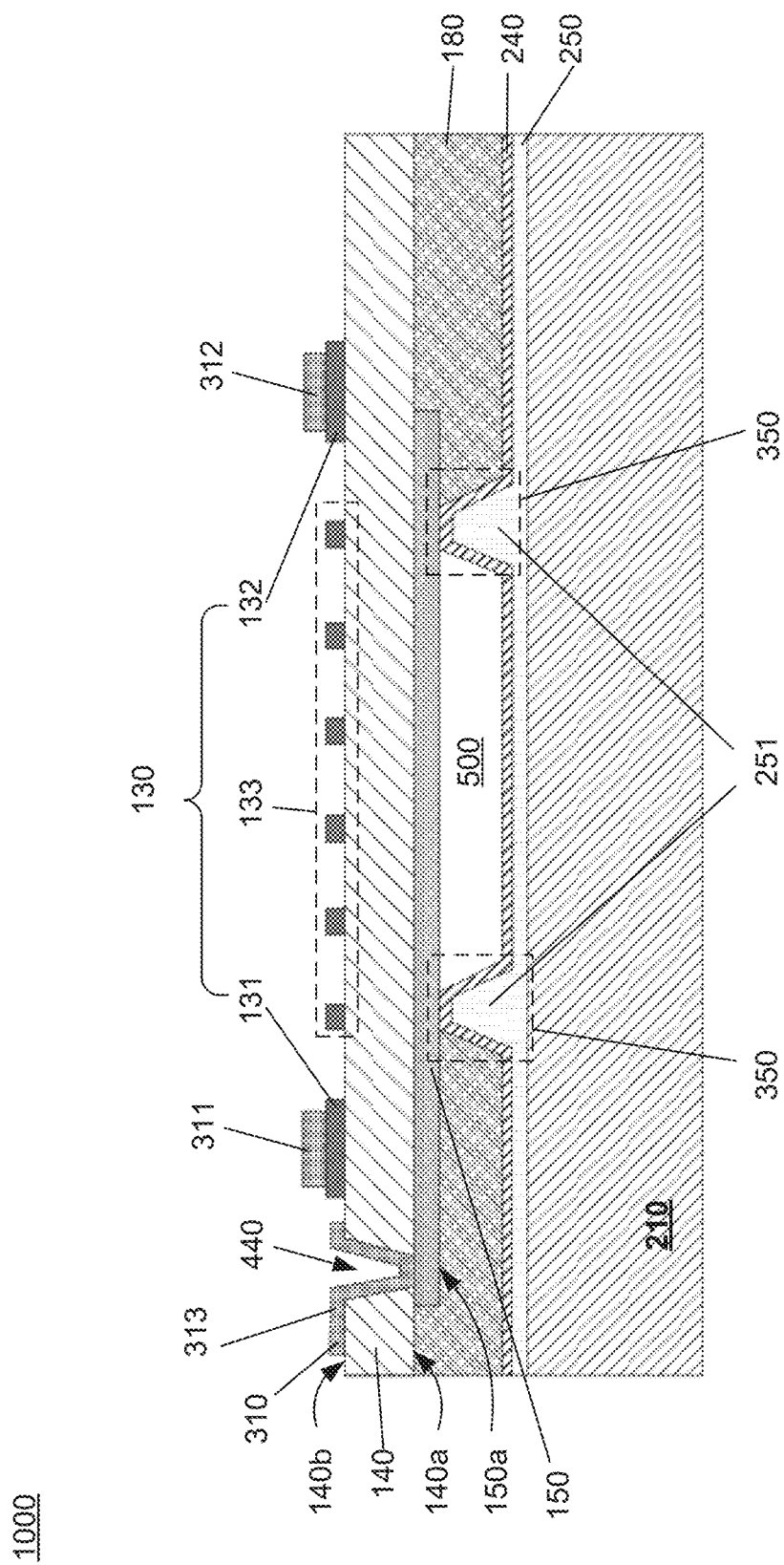
FIG. 1A is a cross-sectional view of a SAW filter, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "top," "bottom," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

Figure 1B:
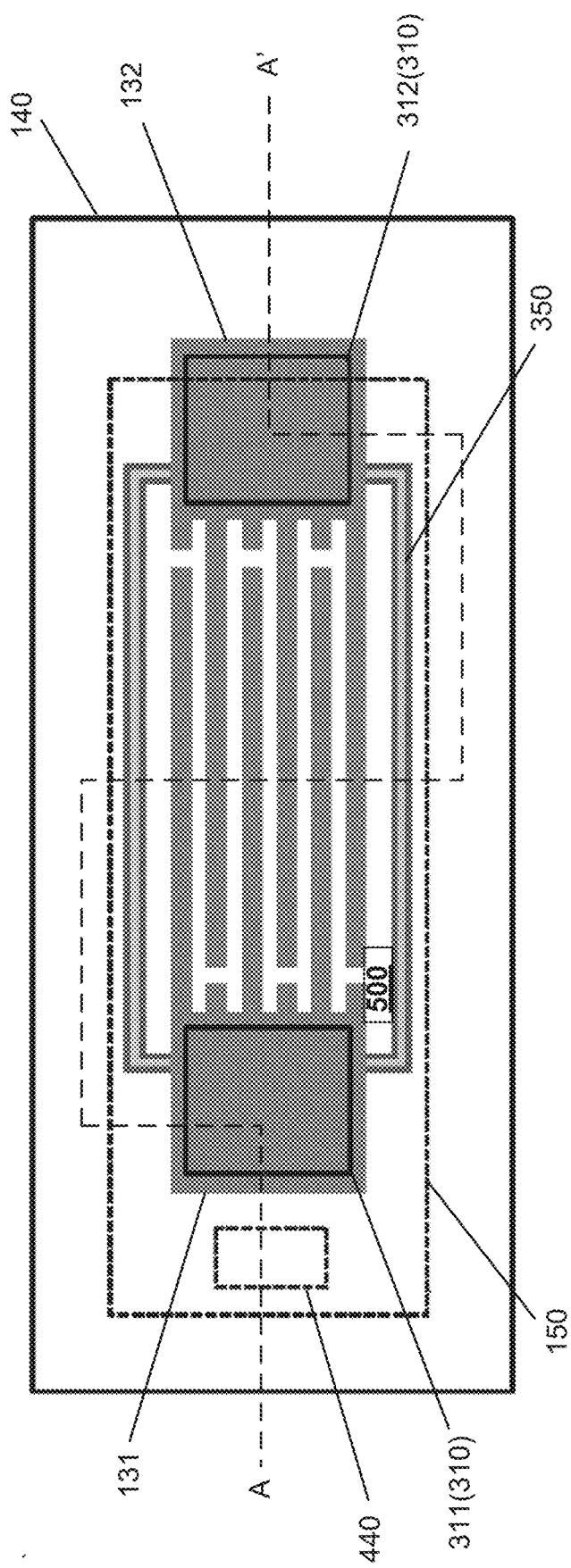
FIG. 1B is a top view showing selected portions of the SAW filter of FIG. 1A, according to an embodiment of the present disclosure.

FIG. 1A is a cross-sectional view of a SAW filter 1000, according to an embodiment of the present disclosure. FIG. 1B is a top view showing selected portions of SAW filter 1000, according to an embodiment of the present disclosure. A cross section of the selected portions in FIG. 1B along line A-A' is illustrated in FIG. 1A. As illustrated in FIGS. 1A and 1B, SAW filter 1000 includes a bottom substrate 210, a piezoelectric layer 140 disposed above bottom substrate 210 and having a bottom surface 140a facing bottom substrate 210 and a top surface 140b parallel with and opposite to bottom surface 140a, a cavity 500 disposed below piezoelectric layer 140, an interdigital transducer (IDT) 130 disposed on top surface 140b of piezoelectric layer 140, and a back electrode 150 disposed on bottom surface 140a of piezoelectric layer 140, at least a portion of a bottom surface 150a of back electrode 150 being exposed in cavity 500.

Figure 1C:
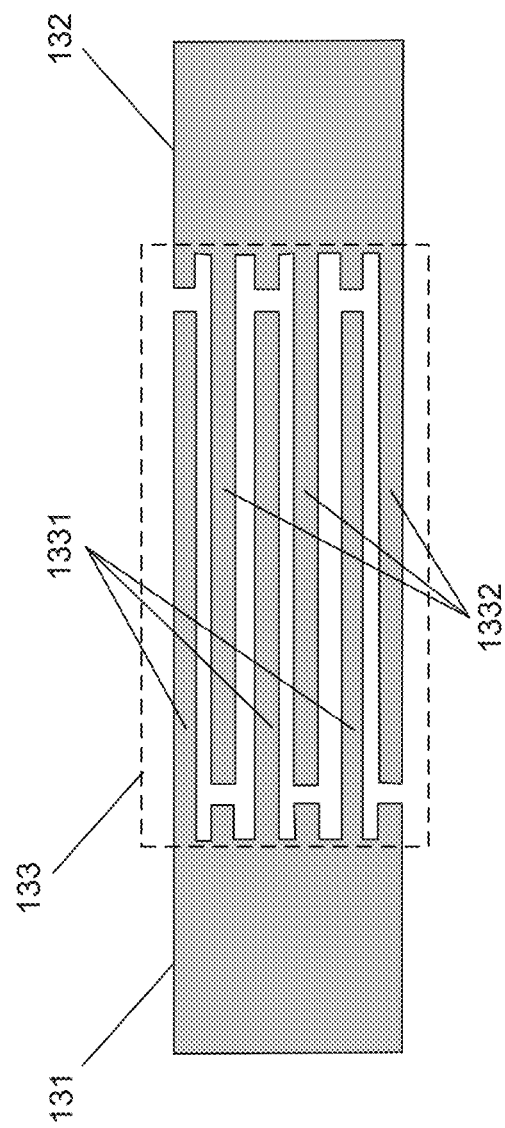
FIG. 1C is a top view of an interdigital transducer (IDT), according to an embodiment of the present disclosure.

FIG. 1C is a top view of IDT 130, according to an embodiment of the present disclosure. IDT 130 includes a first input and output end 131, a second input and output end 132, and an interdigital portion 133. Interdigital portion 133 includes a first set of electrode fingers 1331 coupled to first input and output end 131, and a second set of electrode fingers 1332 coupled to second input and output end 132. The second set of electrode fingers 1332 are interleaved with and parallel to the first set of electrode fingers 1331. Interdigital portion 133 is vertically aligned with cavity 500.

Referring back to FIGS. 1A and 1B, a first dielectric layer 180 is disposed between piezoelectric layer 140 and bottom substrate 210, and covers bottom surface 140a of piezoelectric layer 140 and bottom surface 150a of back electrode 150. A second dielectric layer 240 is disposed below first dielectric layer 180 and contacting a portion of bottom surface 150a of back electrode 150. A third dielectric layer 250 is disposed below second dielectric layer 240, and includes a protruding structure 251 protruding toward first dielectric layer 180. Protruding structure 251 and the portions of second dielectric layer 240 disposed on sidewalls of protruding structure 251 constitute a double-wall boundary structure 350 that surrounds cavity 500. In other words, back electrode 150, second dielectric layer 240, and third dielectric layer 250 together enclose cavity 500.

First dielectric layer 180 may be formed of silicon oxide, silicon nitride, or a stacked combination of those materials. Second dielectric layer 240 may be formed of a non-conductive material that cannot be etched by hydrofluoric acid, including, but not limited to, polysilicon, amorphous silicon, AlN, SiN, TaN, GaN, or a stacked combination of two or more of those materials. Third dielectric layer 250 may be formed of silicon oxide, silicon nitride, or a stacked combination of those materials. Bottom substrate 210 may be formed of Si, $SiO_2$, polysilicon, silicon carbide, sapphire ($Al_2O_3$), or a stacked combination of two or more of those materials. Bottom substrate 210 may be bonded to third dielectric layer 250.

An opening 440 is formed in piezoelectric layer 140 and exposes a portion of a top surface of back electrode 150. A pad metal layer 310 is disposed on piezoelectric layer 140. A first section 311 of pad metal layer 310 is disposed on and electrically connected to first input and output end 131 of IDT 130, a second section 312 of pad metal layer 310 is disposed on and electrically connected to second input and output end 132 of IDT 130, and a third section 313 of pad metal layer 310 is disposed in opening 440 of piezoelectric layer 140 and electrically connected to back electrode 150 via opening 440.

Figure 1D:
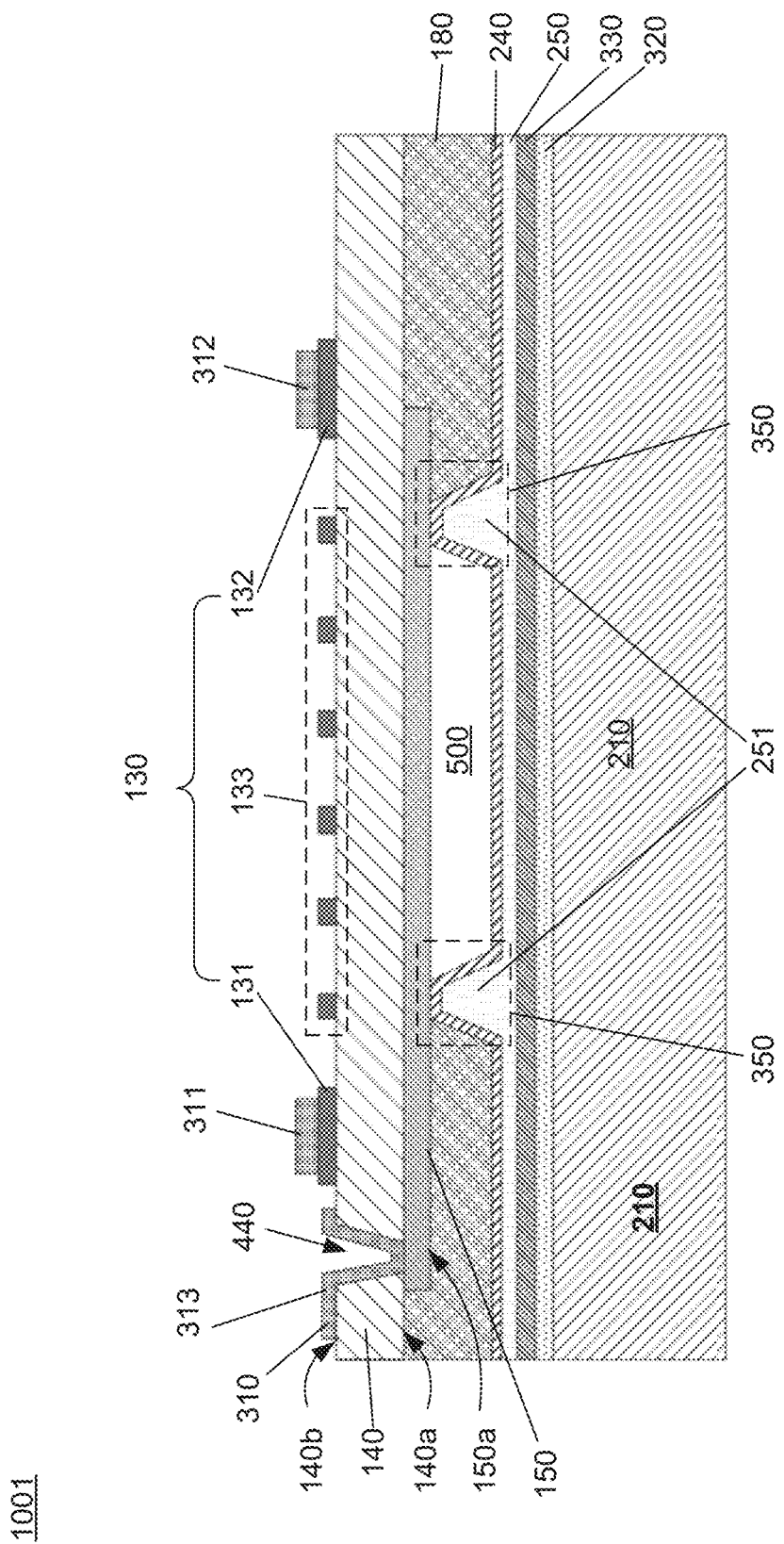
FIG. 1D is a cross-sectional view of a SAW filter, according to an embodiment of the present disclosure.

FIG. 1D is a cross-sectional view of a SAW filter 1001, according to an embodiment of the present disclosure. SAW filter 1001 differs from SAW filter 1000 in that SAW filter 1001 includes a non-conductive layer 320 and a buffer layer 330 disposed between third dielectric layer 250 and bottom substrate 210.

Specifically, non-conductive layer 320 is disposed above bottom substrate 210, and buffer layer 330 disposed above non-conductive layer 320. Non-conductive layer 320 and buffer layer 330 function to make the bonding of bottom substrate 210 easier and to ensure the quality of the bonding, or to improve the performance of SAW filter 1001 by improving a quality factor Q of a SAW resonator. Non-conductive layer 320 may be formed of polysilicon, amorphous silicon, silicon nitride, aluminum nitride, gallium nitride, or a stacked combination of two or more of those materials. Non-conductive layer 320 functions to improve the quality factor Q of the SAW resonator. Buffer layer 330 may be formed of silicon nitride, silicon oxide, or a stacked combination of those materials. Buffer layer 330 functions to create a suitable bonding surface for bottom substrate 210, or to balance a warpage of bottom substrate 210, so that bottom substrate 210 is bonded to third dielectric layer 250 more smoothly.

In some alternative embodiments, a SAW filter may include only one of non-conductive layer 320 and buffer layer 330. For example, a SAW filter may include non-conductive layer 320 disposed between third dielectric layer 250 and bottom substrate 210. Alternatively, a SAW filter may include buffer layer 330 disposed between third dielectric layer 250 and bottom substrate 210.

Except for non-conductive layer 320 and buffer layer 330, the structure and components of SAW filter 1001 are the same as those of SAW filter 1000, and therefore detailed descriptions of the other components of SAW filter 1001 are not repeated.

Figure 2:
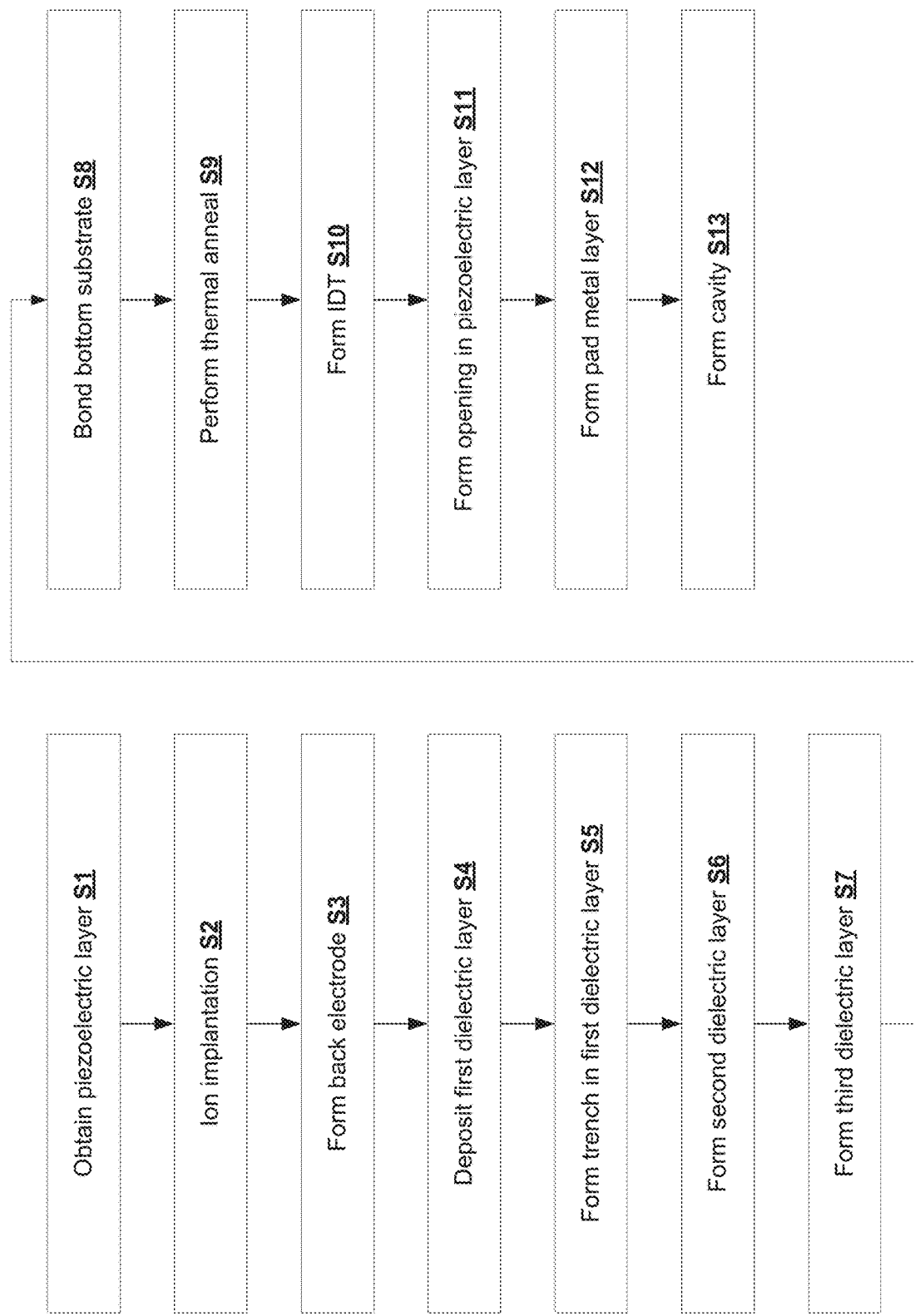
FIG. 2 is a flow chart of a process of fabricating the SAW filter of FIG. 1A, according to an embodiment of the present disclosure.

FIG. 2 is a flow chart of a process of fabricating SAW filter 1000, according to an embodiment of the present disclosure. FIGS. 3A-3M are cross-sectional views of structures formed in the process of FIG. 2, according to an embodiment of the present disclosure.

Figure 3A:
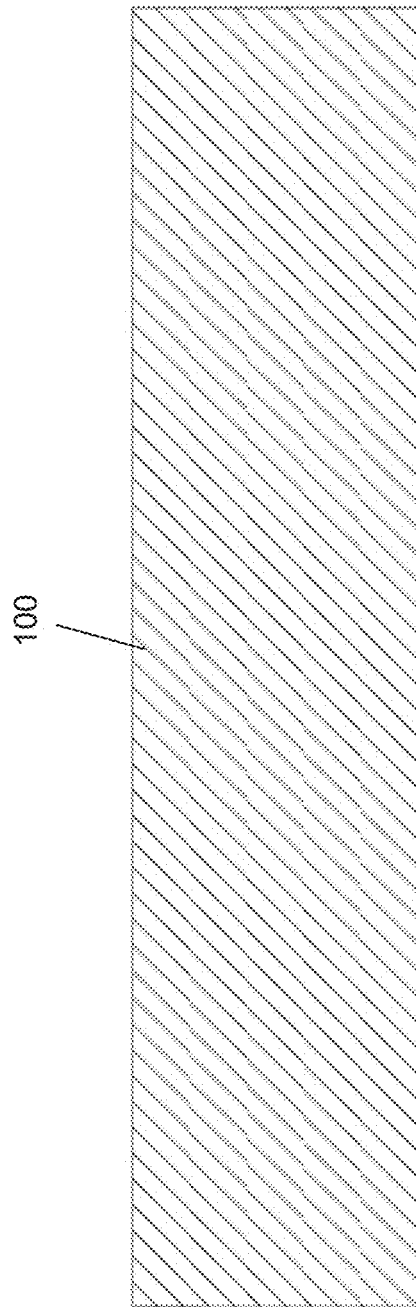

As illustrated in FIG. 3A, in step S1, a piezoelectric substrate 100 is obtained. The piezoelectric substrate may be a lithium niobate or lithium tantalate single crystal substrate.

Figure 3B:
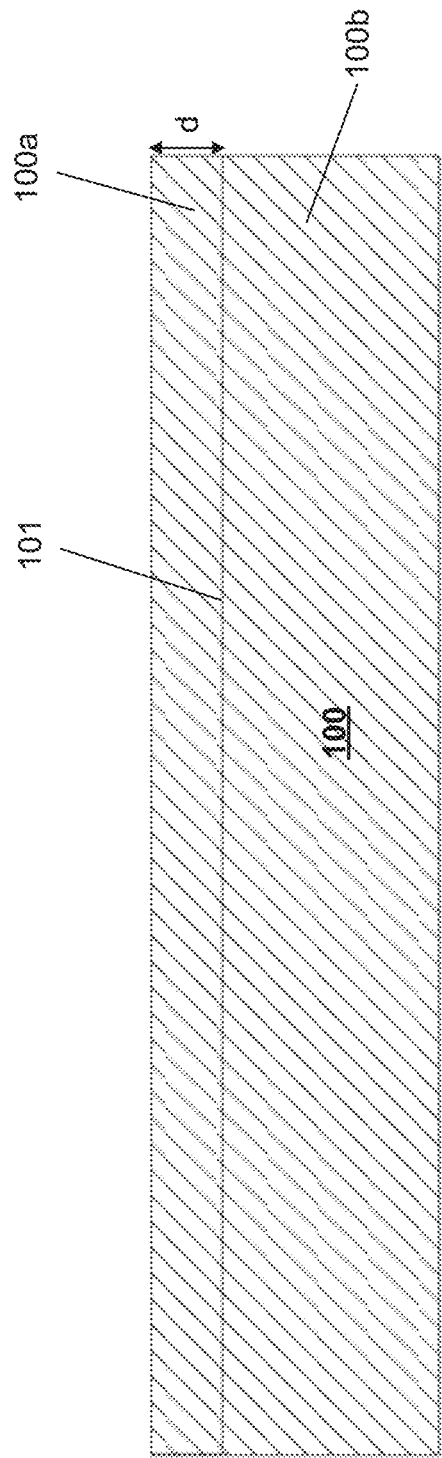

As illustrated in FIG. 3B, in step S2, ions are implanted into piezoelectric substrate 100 at a predetermined implantation depth d, thereby forming an ion layer 101 at depth d of piezoelectric substrate 100. The ions may be helium or hydrogen ions. Implantation depth d may be determined based on a desired thickness of piezoelectric layer 140. For example, implantation depth d may range from approximately 0.3 μm to approximately 10 μm. A first portion 100a of piezoelectric substrate 100 is disposed above ion layer 101, and a second portion 100b of piezoelectric substrate 100 is disposed below ion layer 101.

Figure 3C:
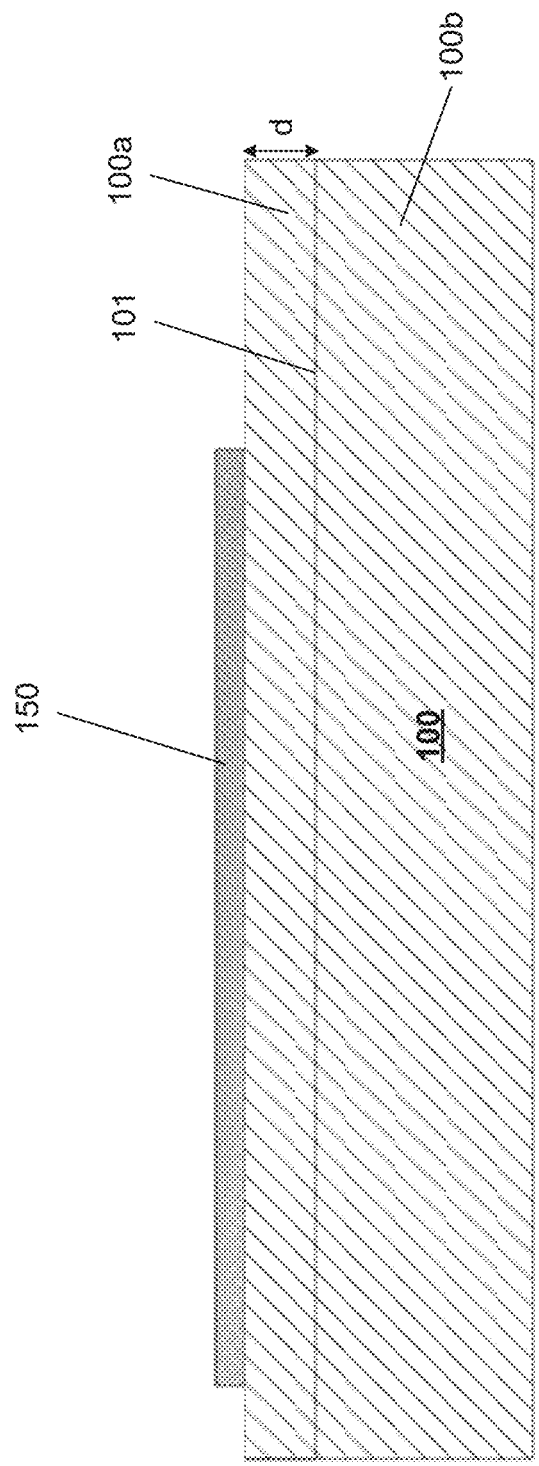

As illustrated in FIG. 3C, in step S3, back electrode 150 is formed on first portion 100a of piezoelectric substrate 100. Back electrode 150 may include any suitable conductive material, such as various metal materials with conductive properties or a stack of several conductive metal materials, such as molybdenum (Mo), aluminum (Al), copper (Cu), platinum (Pt), tantalum (Ta), tungsten (W), palladium (Pd), ruthenium (Ru), etc.

Figure 3D:
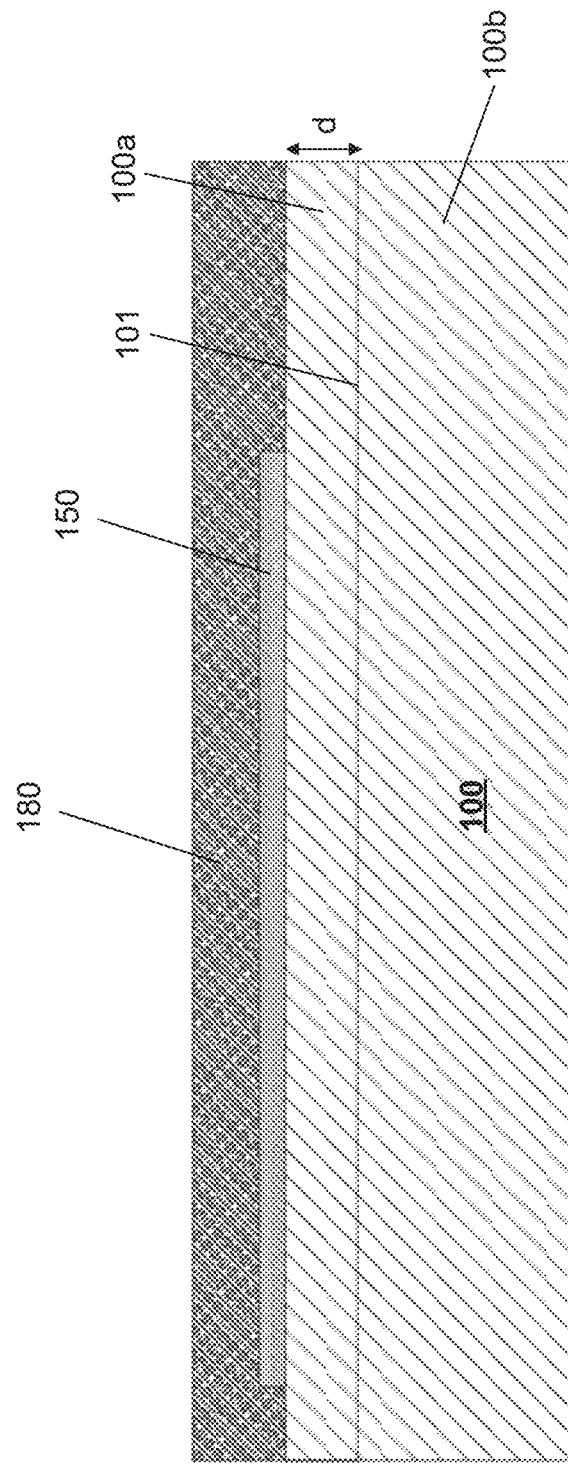

As illustrated in FIG. 3D, in step S4, first dielectric layer 180 is deposited on first portion 100a of piezoelectric substrate 100, covering back electrode 150. First dielectric layer 180 may include silicon oxide, silicon nitride, or a stacked combination of these materials. First dielectric layer 180 may by deposited by using a physical vapor deposition (PVD) process or a low temperature chemical vapor deposition (CVD) process.

As illustrated in FIG. 3E, in step S5, first dielectric layer 180 is patterned by etching to form a trench 190 that exposes a portion of back electrode 150. The patterned first dielectric layer 180 includes a peripheral section 181 and an island section 182 separated from each other by trench 190. Peripheral section 181 surrounds trench 190, which surrounds island section 182. Island section 182 will be removed during a subsequent etching and releasing process, thereby forming cavity 500.

As illustrated in FIG. 3F, in step S6, second dielectric layer 240 is deposited on the structure of FIG. 3E. That is, second dielectric layer 240 is deposited on a top surface of first dielectric layer 180, side surfaces of trench 190, and the portions of back electrode 150 that were exposed by trench 190. As a result, island section 182 of first dielectric layer 180 is enclosed by second dielectric layer 240 and back electrode 150. Therefore, the subsequently formed cavity 500 is enclosed by second dielectric layer 240 and back electrode 150. Second dielectric layer 240 may be formed of a non-conductive material that cannot be etched by hydrofluoric acid, including, but not limited to, polysilicon, amorphous silicon, AlN, SiN, TaN, GaN, or a stacked combination of two or more of those materials.

Figure 3G:
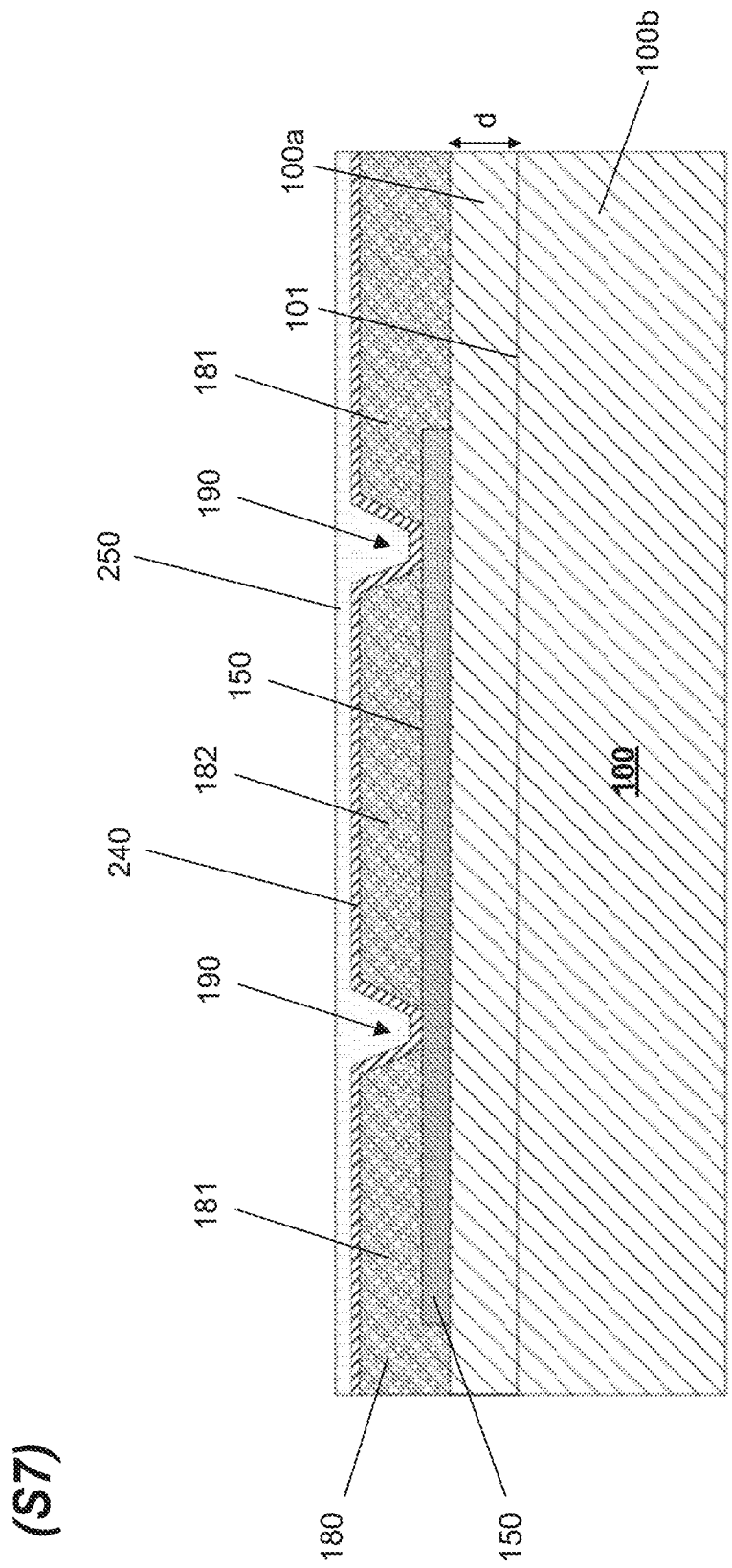

As illustrated in FIG. 3G, in step S7, third dielectric layer 250 is deposited on the structure of FIG. 3F. That is, third dielectric layer 250 is deposited on second dielectric layer 240 and filling in trench 190. The portion of third dielectric layer 250 that fills in trench 190 constitutes protruding structure 251 (FIGS. 1A and 1D) in SAW filter 1000. Then, a top surface of third dielectric layer 250 is polished by, for example, chemical mechanical polishing (CMP) so that the top surface of third dielectric layer 250 is parallel to a major plane of piezoelectric substrate 100. The third dielectric layer may be a non-conductive material such as silicon oxide, silicon nitride, or a stacked combination thereof.

Figure 3H:
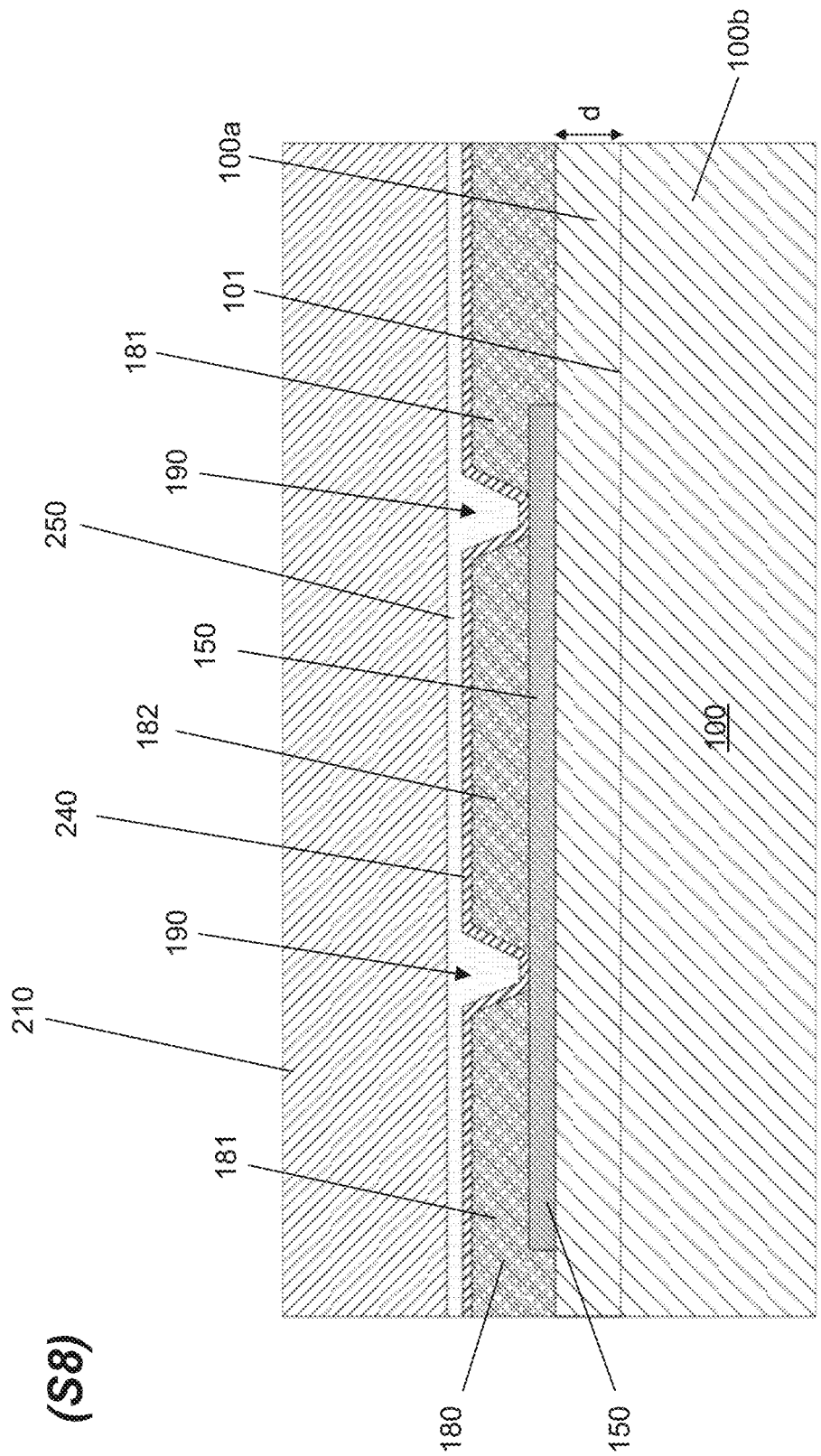

As illustrated in FIG. 3H, in step S8, bottom substrate 210 is bonded to third dielectric layer 180. Bottom substrate 210 may include Si, $SiO_2$, polysilicon, silicon carbide, sapphire ($Al_2O_3$), or a stacked combination of two or more of those materials.

Figure 3I:
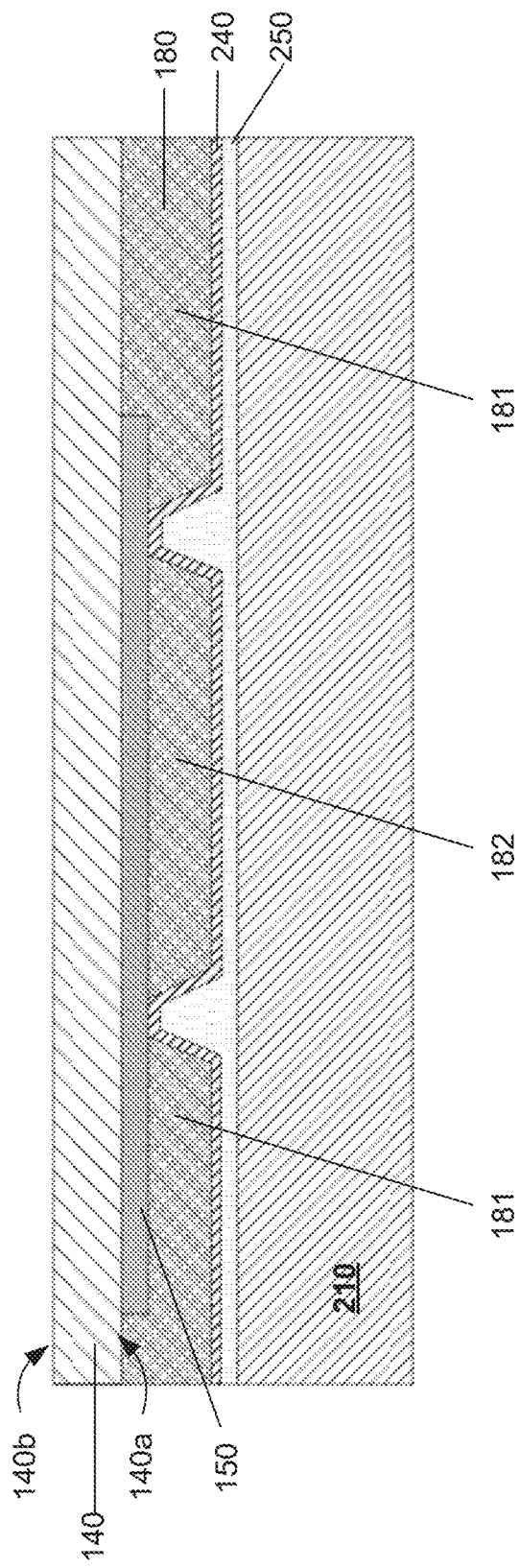

As illustrated in FIG. 3I, in step S9, the structure shown in FIG. 3H is flipped over and a thermal anneal is performed on the structure. The annealing temperature may range from approximately 400° C. to approximately 650° C. As a result of the thermal anneal, ion layer 101 in piezoelectric substrate 100 is broken. Second portion 100b of piezoelectric substrate 100 below ion layer 101 is removed, while first portion 100a of piezoelectric substrate 100 above ion layer 101 remains. First portion 100a of piezoelectric substrate 100 constitutes piezoelectric layer 140 in SAW filter 1000. Piezoelectric layer 140 has bottom surface 140a where back electrode 150 is formed, and top surface 140b exposed. A CMP may be performed on the exposed top surface 140b of piezoelectric layer 140 to obtain a smooth surface, and to achieve the desired thickness of piezoelectric layer 140 in SAW filter 1000. In some embodiments, an ion beam etching (IBE) or ion beam milling process may be performed on piezoelectric layer 140 to achieve a more uniform thickness.

Figure 3J:
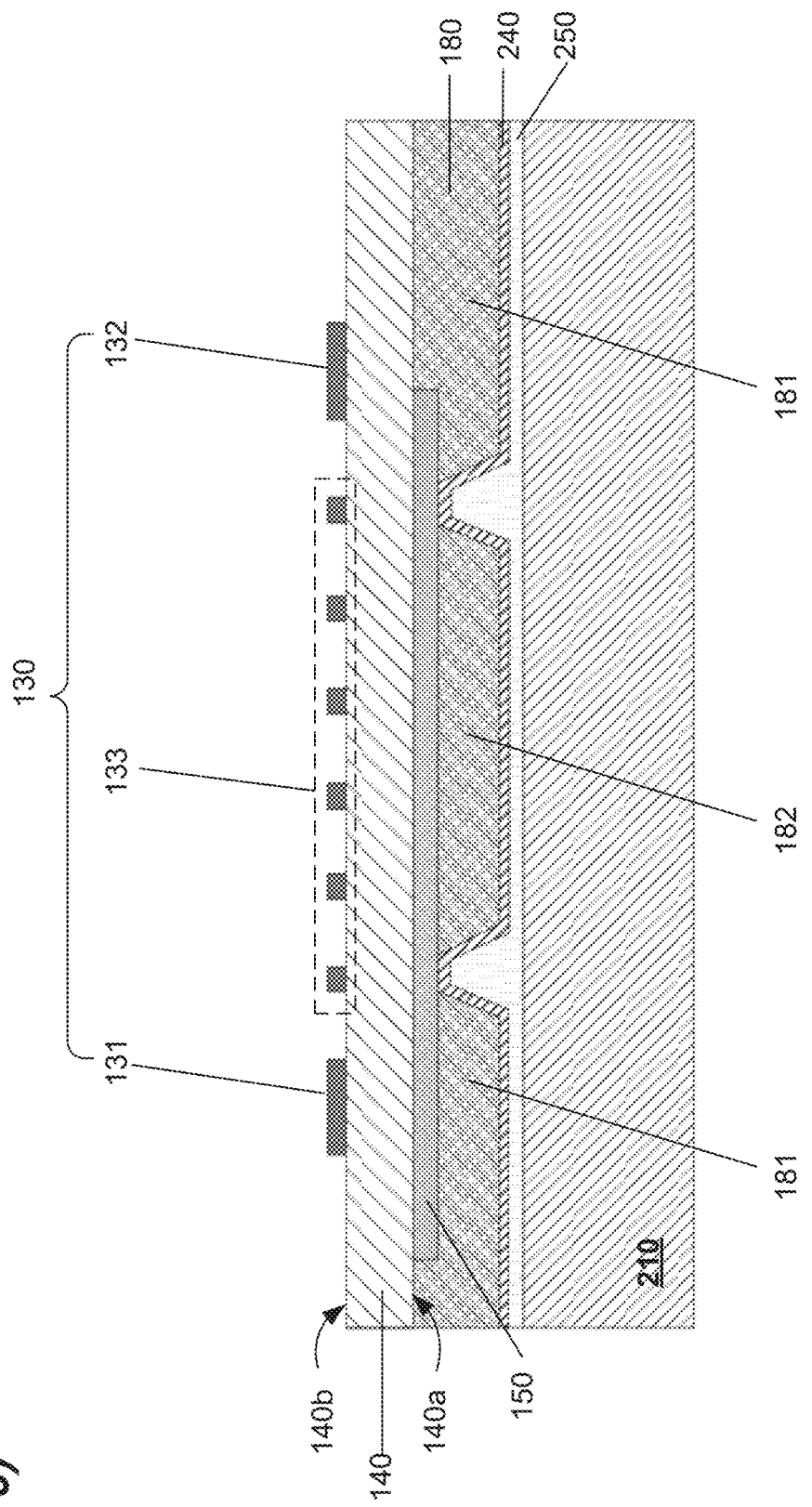

As illustrated in FIG. 3J, in step S10, IDT 130 is formed on top surface 140b of piezoelectric layer 140. IDT 130 includes first input and output end 131, second input and output end 132, and interdigital portion 133 disposed between first and second input and output ends 131 and 132. Interdigital portion 133 is vertically aligned with back electrode 150.

Figure 3K:
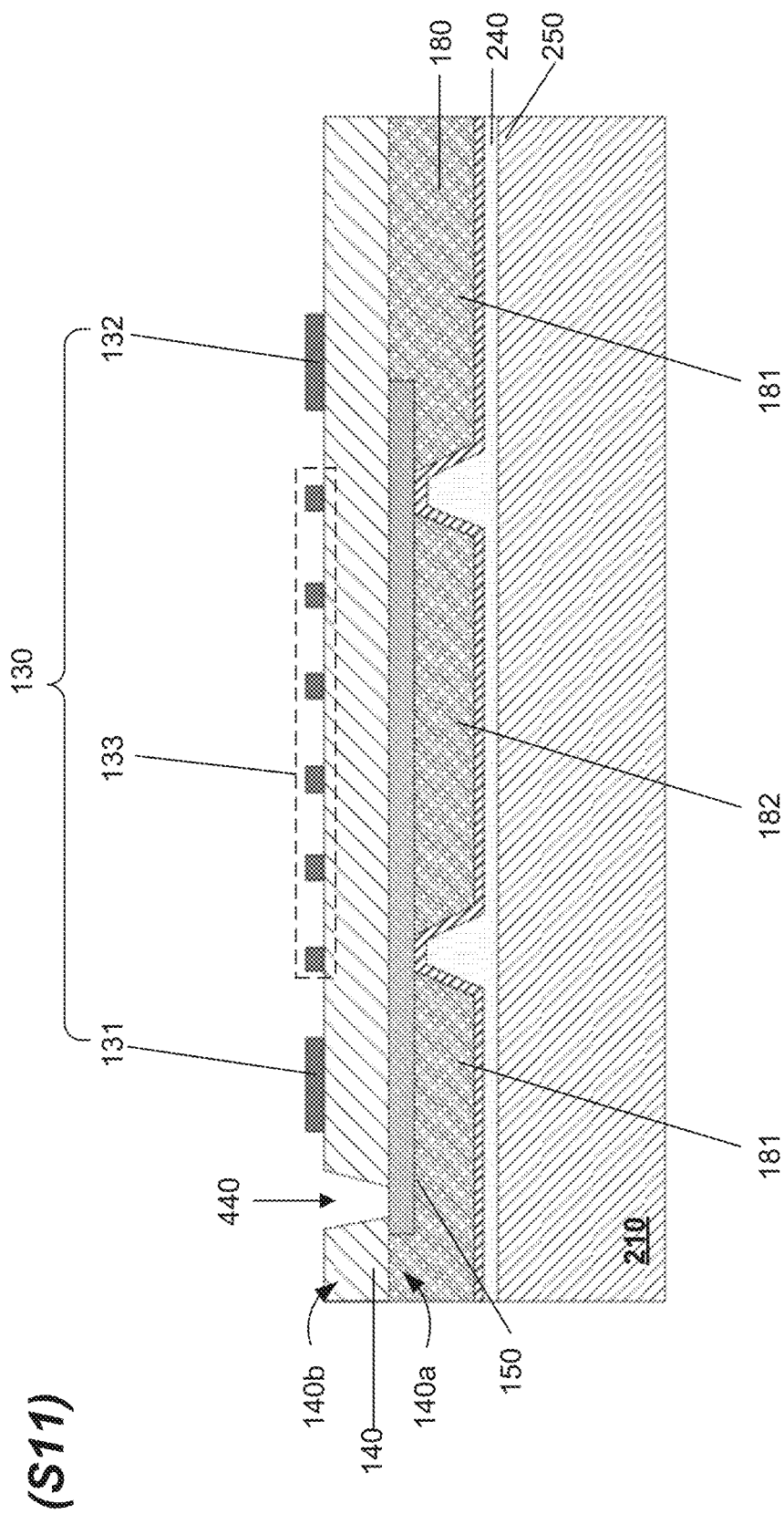

As illustrated in FIG. 3K, in step S11, piezoelectric layer 140 is etched to form an opening 440 exposes a portion of the top surface of back electrode 150. Although not shown in FIG. 3K, a release hole is also formed in piezoelectric layer 140 by etching, to expose a portion of island section 182 of first dielectric layer 180. The release hole is used for forming cavity 500 in the subsequent etching and releasing process.

Figure 3L:
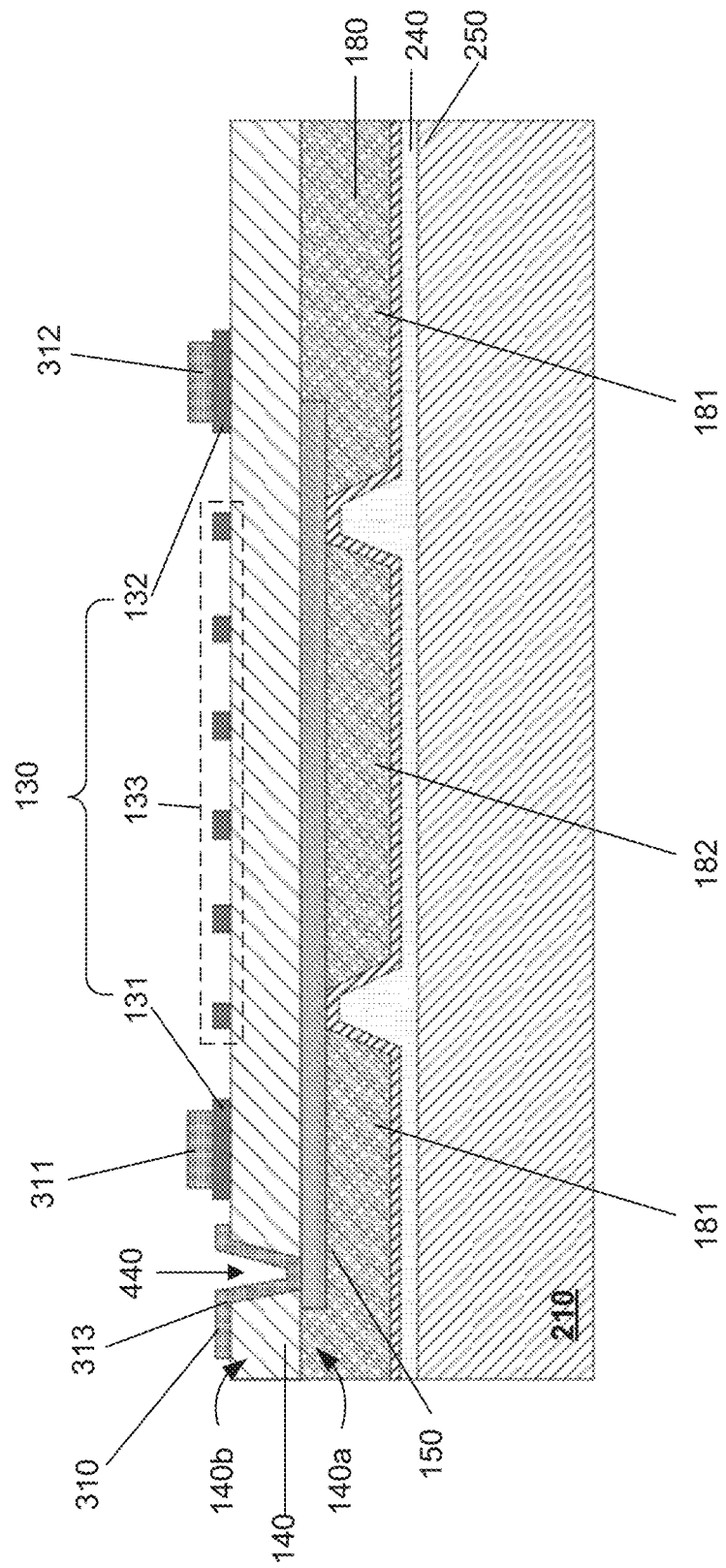

As illustrated in FIG. 3L, in step S12, a pad metal layer 310 is formed on the structure of FIG. 3K. Then, pad metal layer 310 is patterned to form first section 311 disposed above and electrically connected to first input and output end 131 of IDT 130, second section 312 disposed above and electrically connected to second input and output end 132 of IDT 130, and third section 313 disposed in opening 440 of piezoelectric layer 140 and electrically connected to back electrode 150 via opening 440.

Figure 3M:
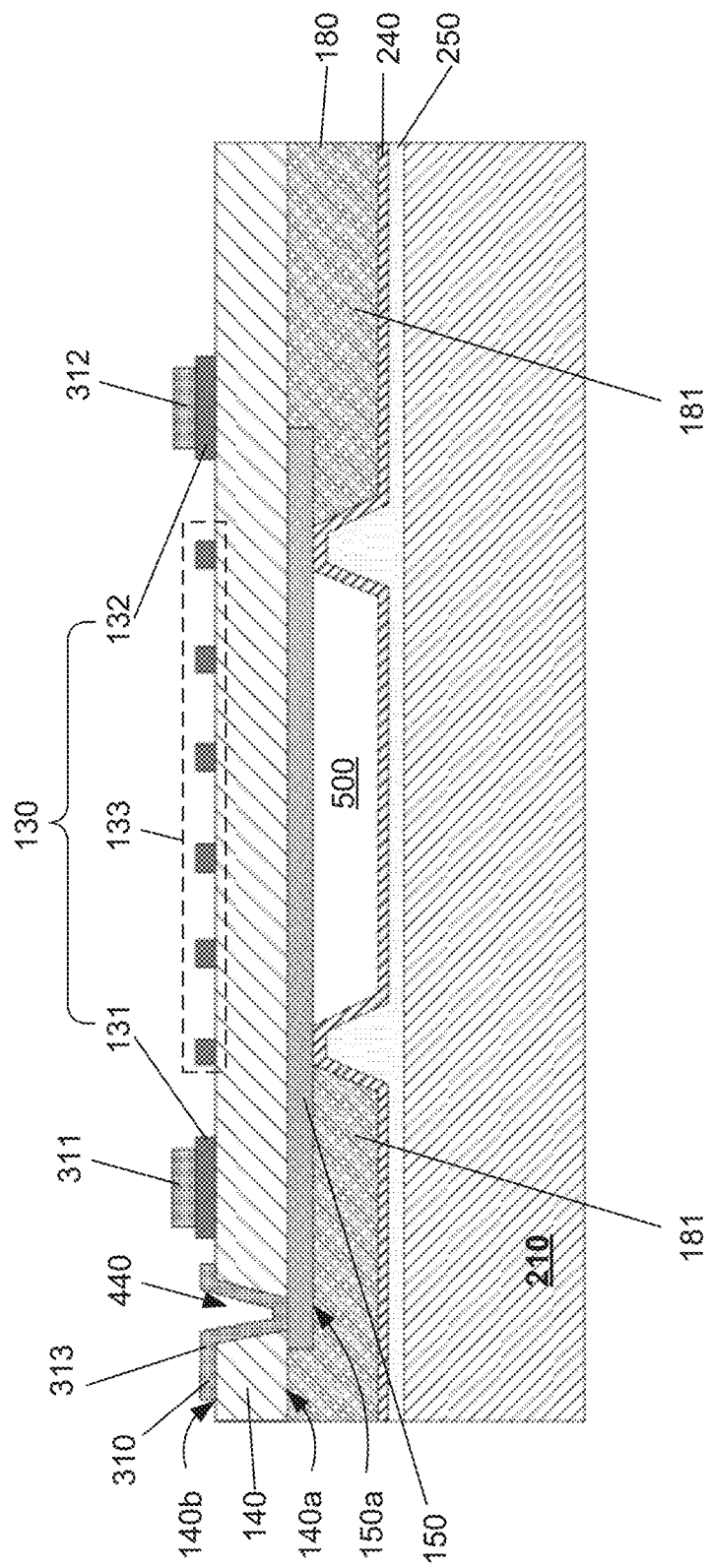

As illustrated in FIG. 3M, in step S13, island section 182 of first dielectric layer 180 is etched and released to form cavity 500 below back electrode 150. Island section 182 may be etched by a dry etch process using $XeF_2$ plasma. The etchant and etching products of the etching process may be released through the release hole formed in piezoelectric layer in step S11. Thus, SAW filter 1000 illustrated in FIG. 1A is fabricated.

Figure 4:
FIG. 4 is a flow chart of a process of fabricating the SAW filter of FIG. 1D, according to an embodiment of the present disclosure.

FIG. 4 is a flow chart of a process of fabricating SAW filter 1001 illustrated FIG. 1D, according to an embodiment of the present disclosure. The process of fabricating SAW filter 1001 as the process of fabricating SAW filter 1000 except that, at step S8, bottom substrate 210 is obtained, at least one of non-conductive layer 320 or buffer layer 330 are deposited on bottom substrate 210, and then bottom substrate 210 deposited with at least one of non-conductive layer 320 or buffer layer 330 is bonded to third dielectric layer 250. When both of non-conductive layer 320 and buffer layer 330 are deposited on bottom substrate 210, non-conductive layer 320 is first deposited on bottom substrate 210, and then buffer layer 330 is deposited on non-conductive layer 320.

Except for step S8, the fabrication process of SAW filter 1001 is the same as that of SAW filter 1000, and therefore detailed descriptions of the other steps of fabricating SAW filter 1001 are not repeated.

Figure 5A:
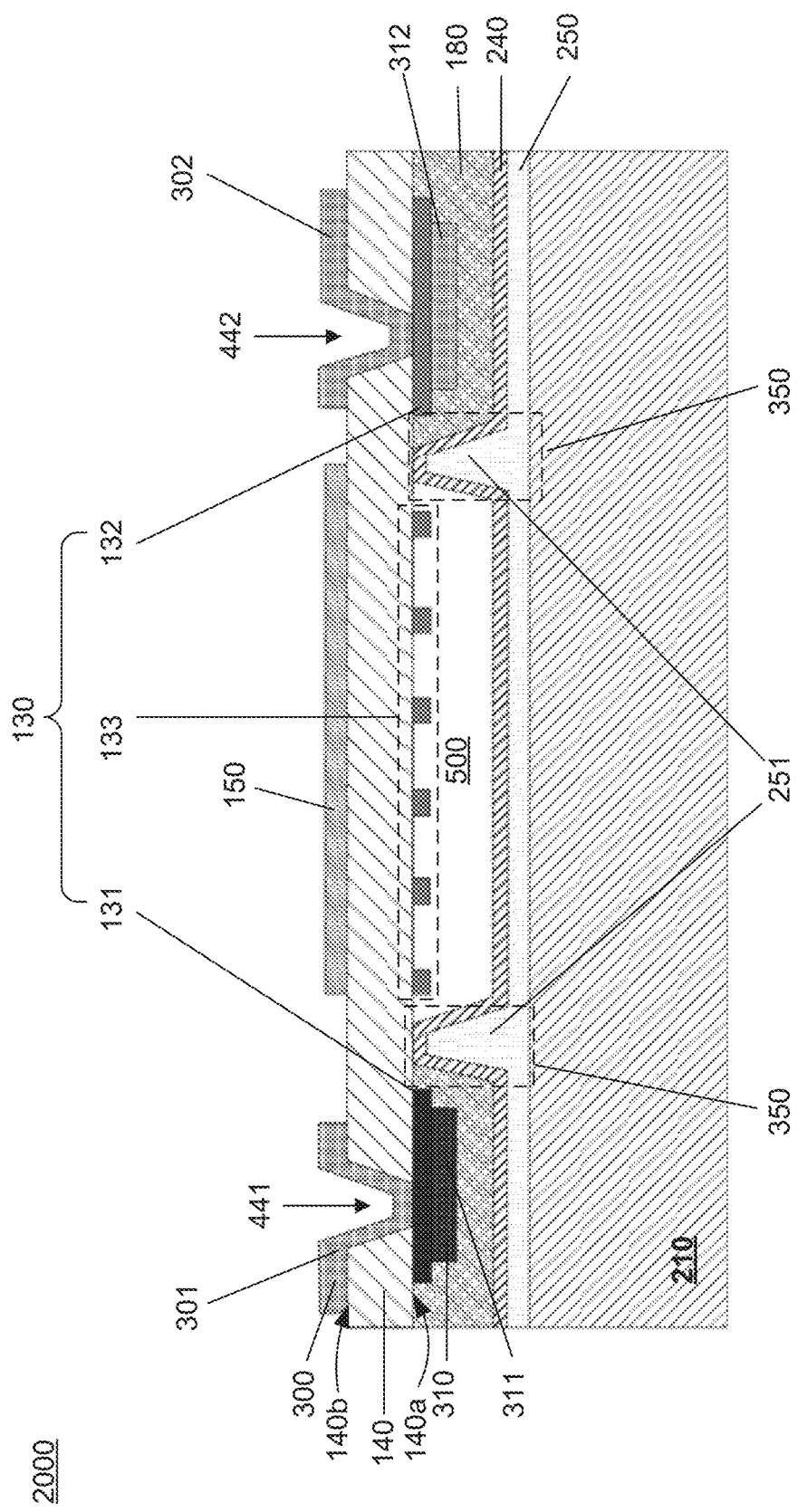
FIG. 5A is a cross-sectional view of a SAW filter, according to an embodiment of the present disclosure.
Figure 5B:
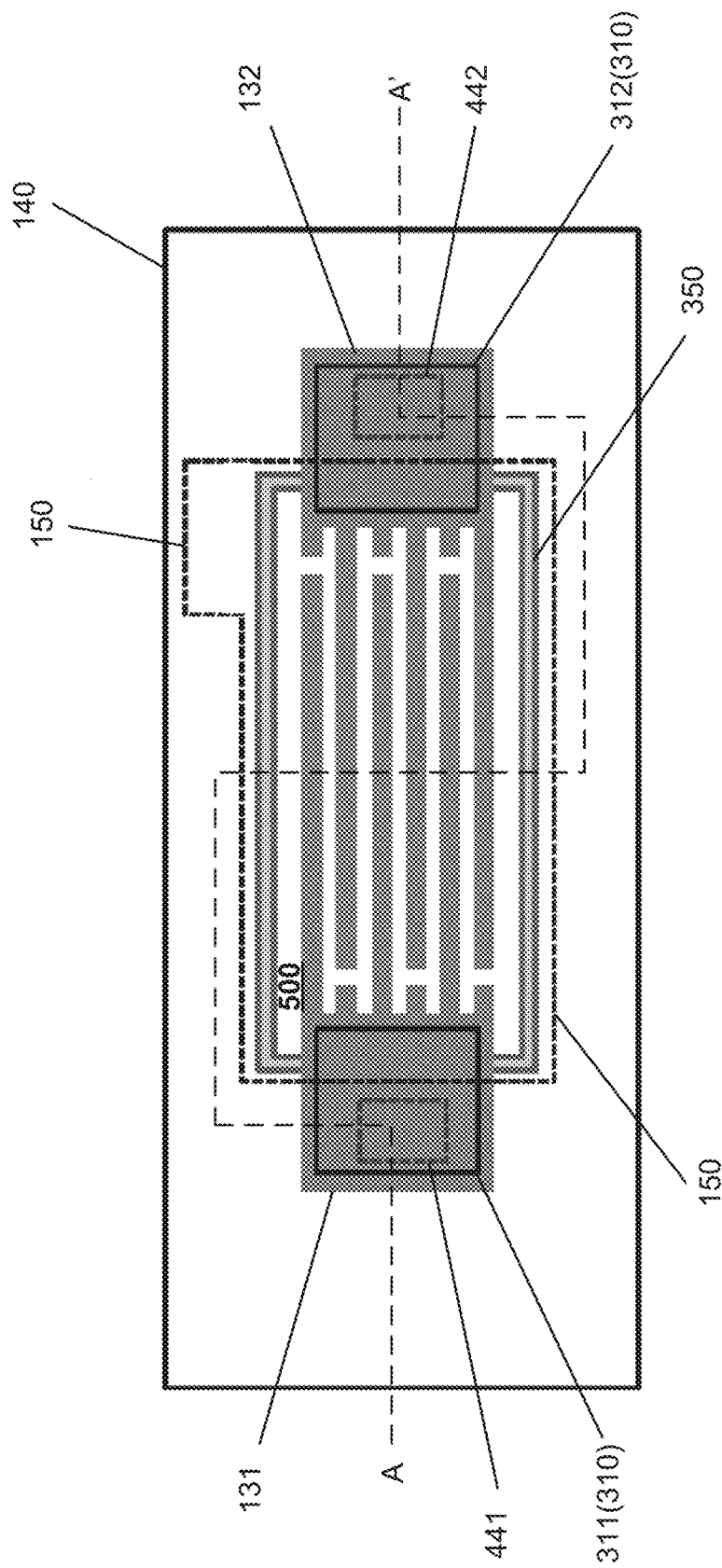
FIG. 5B is a top view showing selected portions of the SAW filter of FIG. 5A, according to an embodiment of the present disclosure.

FIG. 5A is a cross-sectional view of a SAW filter 2000, according to an embodiment of the present disclosure. FIG. 5B is a top view showing selected portions of SAW filter 2000, according to an embodiment of the present disclosure. A cross section of the selected portions in FIG. 5B along line A-A' is illustrated in FIG. 5A. As illustrated in FIGS. 5A and 5B, SAW filter 2000 includes a bottom substrate 210, a piezoelectric layer 140 disposed above bottom substrate 210 and having a bottom surface 140a facing bottom substrate 210 and a top surface 140b parallel with and opposite to bottom surface 140a, a cavity 500 disposed below piezoelectric layer 140, an interdigital transducer (IDT) 130 disposed on bottom surface 140a of piezoelectric layer 140, and a back electrode 150 disposed on top surface 140b of piezoelectric layer 140, at least a portion of back electrode 150 being exposed in cavity 500.

IDT 130 includes a first input and output end 131, a second input and output end 132, and an interdigital portion 133. Interdigital portion 133 includes a first set of electrode fingers coupled to first input and output end 131, and a second set of electrode fingers coupled to second input and output end 132. The second set of electrode fingers are interleaved with and parallel to the first set of electrode fingers. Interdigital portion 133 is vertically aligned with cavity 500.

A first pad metal layer 310 is disposed below IDT 130. A first section 311 of first pad metal layer 310 is disposed below and electrically connected with first input and output end 131 of IDT 130. A second section 312 of first pad metal layer 310 is disposed below and electrically connected with second input and output end 132 of IDT 130.

A first dielectric layer 180 is disposed between piezoelectric layer 140 and bottom substrate 210, and covers bottom surface 140a of piezoelectric layer 140, first and second input and output ends 131 and 132 of IDT 130, and first and second sections 311 and 312 of first pad metal layer 310. A second dielectric layer 240 is disposed below first dielectric layer 180 and contacting a portion of bottom surface 140a of piezoelectric layer 140. A third dielectric layer 250 is disposed below second dielectric layer 240, and includes a protruding structure 251 protruding toward first dielectric layer 180. Protruding structure 251 and the portions of second dielectric layer 240 disposed on sidewalls of protruding structure 251 constitute a double-wall boundary structure 350 that surrounds cavity 500. In other words, piezoelectric layer 140, second dielectric layer 240, and third dielectric layer 250 together enclose cavity 500.

First dielectric layer 180 may be formed of silicon oxide, silicon nitride, or a stacked combination of those materials. Second dielectric layer 240 may be formed of a non-conductive material that cannot be etched by hydrofluoric acid, including, but not limited to, polysilicon, amorphous silicon, AlN, SiN, TaN, GaN, or a stacked combination of two or more of those materials. Third dielectric layer 250 may be formed of silicon oxide, silicon nitride, or a stacked combination of those materials. Bottom substrate 210 may be formed of Si, $SiO_2$, polysilicon, silicon carbide, sapphire ($Al_2O_3$), or a stacked combination of two or more of those materials. Bottom substrate 210 may be bonded to third dielectric layer 250.

A first opening 441 is formed in piezoelectric layer 140 and exposes a portion of first input and output end 131 of IDT 130. A second opening 442 is formed in piezoelectric layer 140 and exposes a portion of second input and output end 132 of IDT 130. A second pad metal layer 300 is disposed on piezoelectric layer 140. A first section 301 of second pad metal layer 300 is disposed on and electrically connected to first input and output end 131 of IDT 130 via first opening 441, and a second section 302 of second pad metal layer 300 is disposed on and electrically connected to second input and output end 132 of IDT 130 via second opening 442.

Figure 5C:
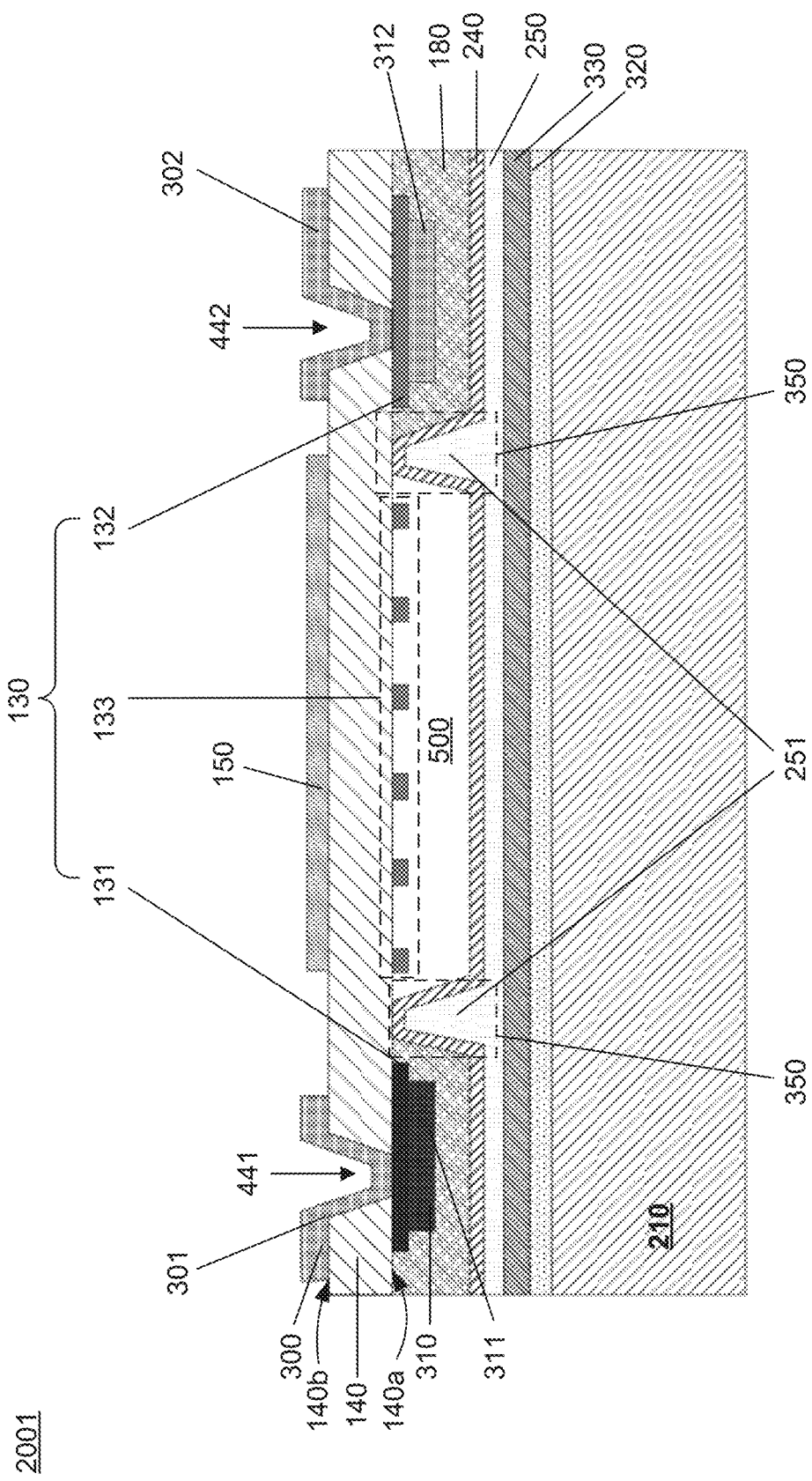
FIG. 5C is a cross-sectional view of a SAW filter, according to an embodiment of the present disclosure.

FIG. 5C is a cross-sectional view of a SAW filter 2001, according to an embodiment of the present disclosure. SAW filter 2001 differs from SAW filter 2000 in that SAW filter 1001 includes a non-conductive layer 320 and a buffer layer 330 disposed between third dielectric layer 250 and bottom substrate 210. Specifically, non-conductive layer 320 is disposed above bottom substrate 210, and buffer layer 330 disposed above non-conductive layer 320. Non-conductive layer 320 may be formed of polysilicon, amorphous silicon, silicon nitride, aluminum nitride, gallium nitride, or a stacked combination of two or more of those materials. Buffer layer 330 may be formed of silicon nitride, silicon oxide, or a stacked combination of those materials.

In some alternative embodiments, a SAW filter may include only one of non-conductive layer 320 and buffer layer 330. For example, a SAW filter may include non-conductive layer 320 disposed between third dielectric layer 250 and bottom substrate 210. Alternatively, a SAW filter may include buffer layer 330 disposed between third dielectric layer 250 and bottom substrate 210.

Except for non-conductive layer 320 and buffer layer 330, the structure and components of SAW filter 2001 are the same as those of SAW filter 2000, and therefore detailed descriptions of the other components of SAW filter 2001 are not repeated.

Figure 6:
FIG. 6 is a flow chart of a process of fabricating the SAW filter of FIG. 5A, according to an embodiment of the present disclosure.
Figure 7A:
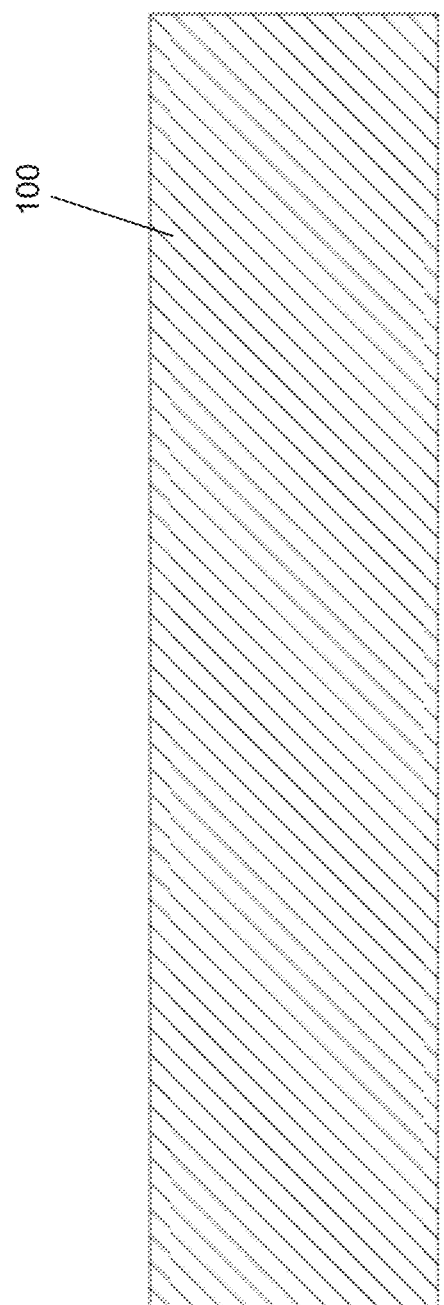
FIGS. 7A-7N are cross-sectional views of structures formed in the process of FIG. 6, according to an embodiment of the present disclosure.

FIG. 6 is a flow chart of a process of fabricating SAW filter 2000, according to an embodiment of the present disclosure. FIGS. 7A-7N are cross-sectional views of structures formed in the process of FIG. 6, according to an embodiment of the present disclosure.

As illustrated in FIG. 7A, in step S1, a piezoelectric substrate 100 is obtained. The piezoelectric substrate may be a lithium niobate or lithium tantalate single crystal substrate.

Figure 7B:
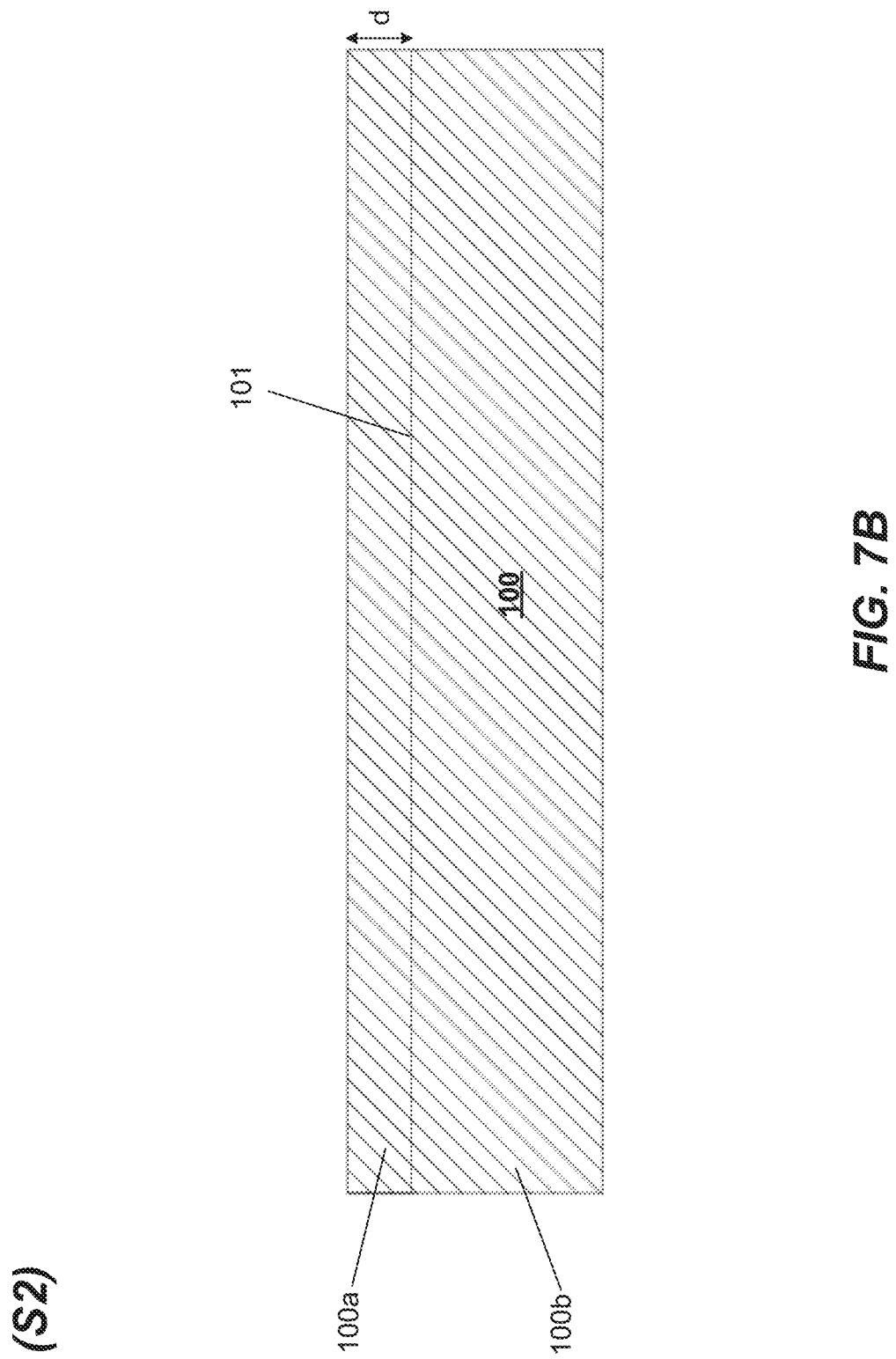

As illustrated in FIG. 7B, in step S2, ions are implanted into piezoelectric substrate 100 at a predetermined implantation depth d, thereby forming an ion layer 101 at depth d of piezoelectric substrate 100. The ions may be helium or hydrogen ions. Implantation depth d may be determined based on a desired thickness of piezoelectric layer 140. For example, implantation depth d may range from approximately 0.3 µm to approximately 10 µm. A first portion 100a of piezoelectric substrate 100 is disposed above ion layer 101, and a second portion 100b of piezoelectric substrate 100 is disposed below ion layer 101.

Figure 7C:
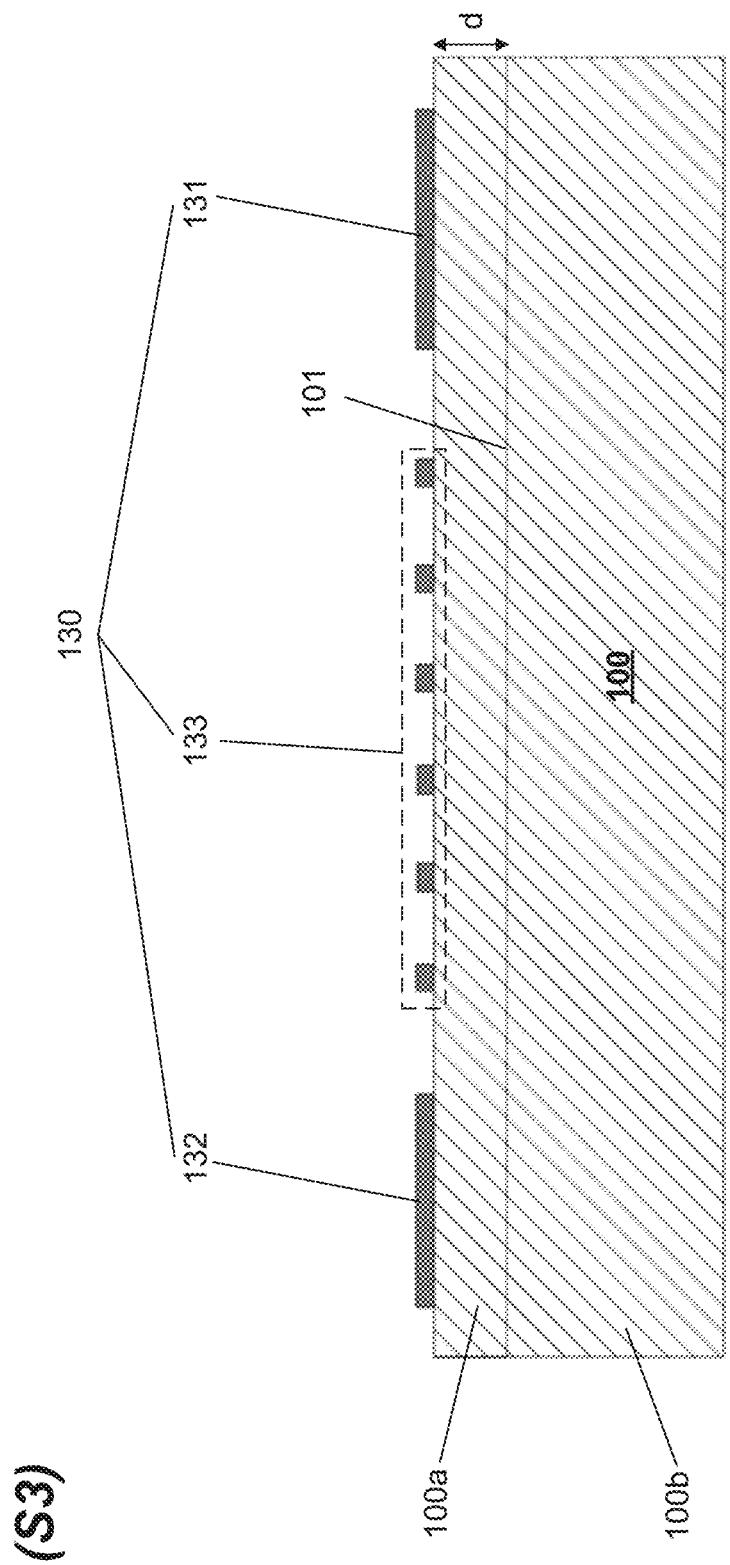

As illustrated in FIG. 7C, in step S3, IDT 130 is formed on first portion 100a of piezoelectric substrate 100. IDT 130 includes first input and output end 131, second input and output end 132, and interdigital portion 133 disposed between first and second input and output ends 131 and 132.

Figure 7D:
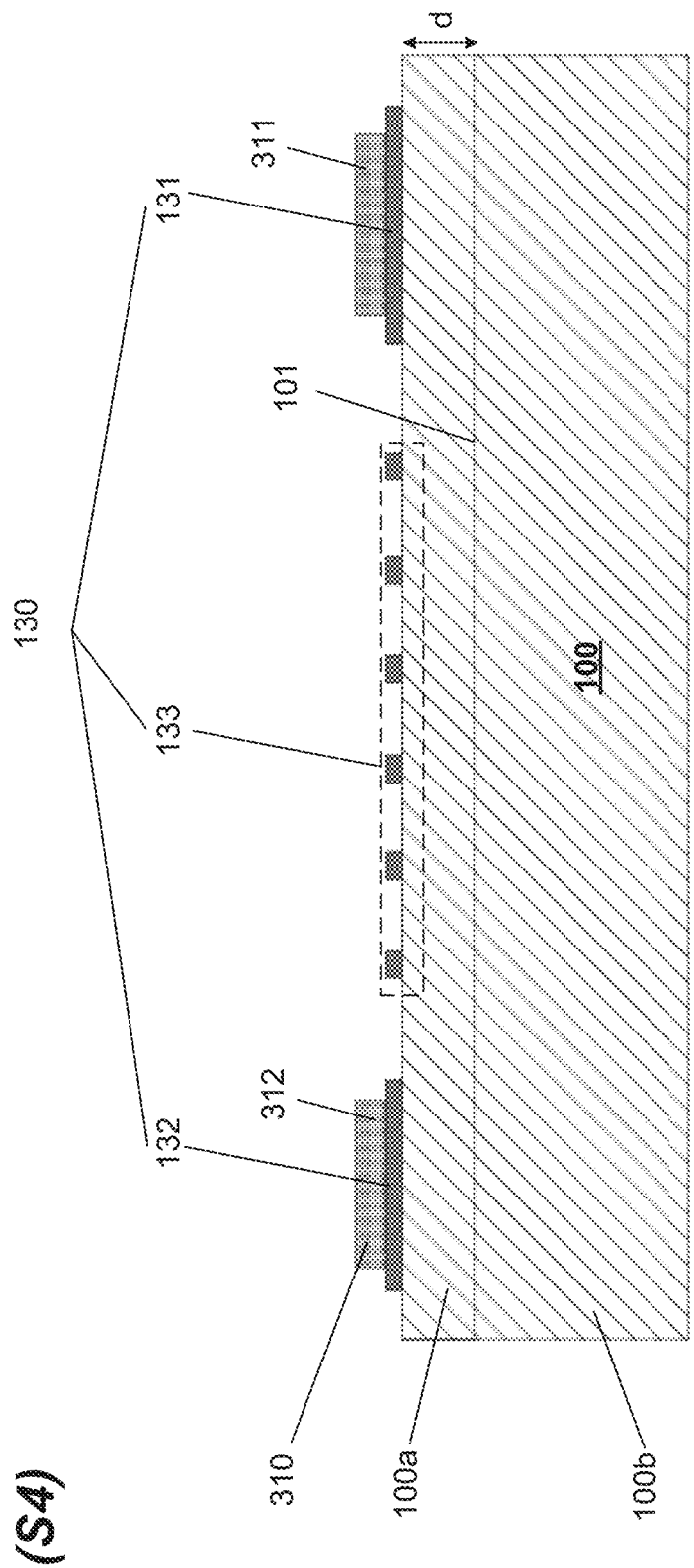

As illustrated in FIG. 7D, in step S4, first pad metal layer 310 is formed on the structure of FIG. 7C. Then, first pad metal layer 310 is patterned to form first section 311 disposed above and electrically connected with first input and output end 131 of IDT 130, and second section 312 disposed above and electrically connected with second input and output end 132 of IDT 130.

Figure 7E:
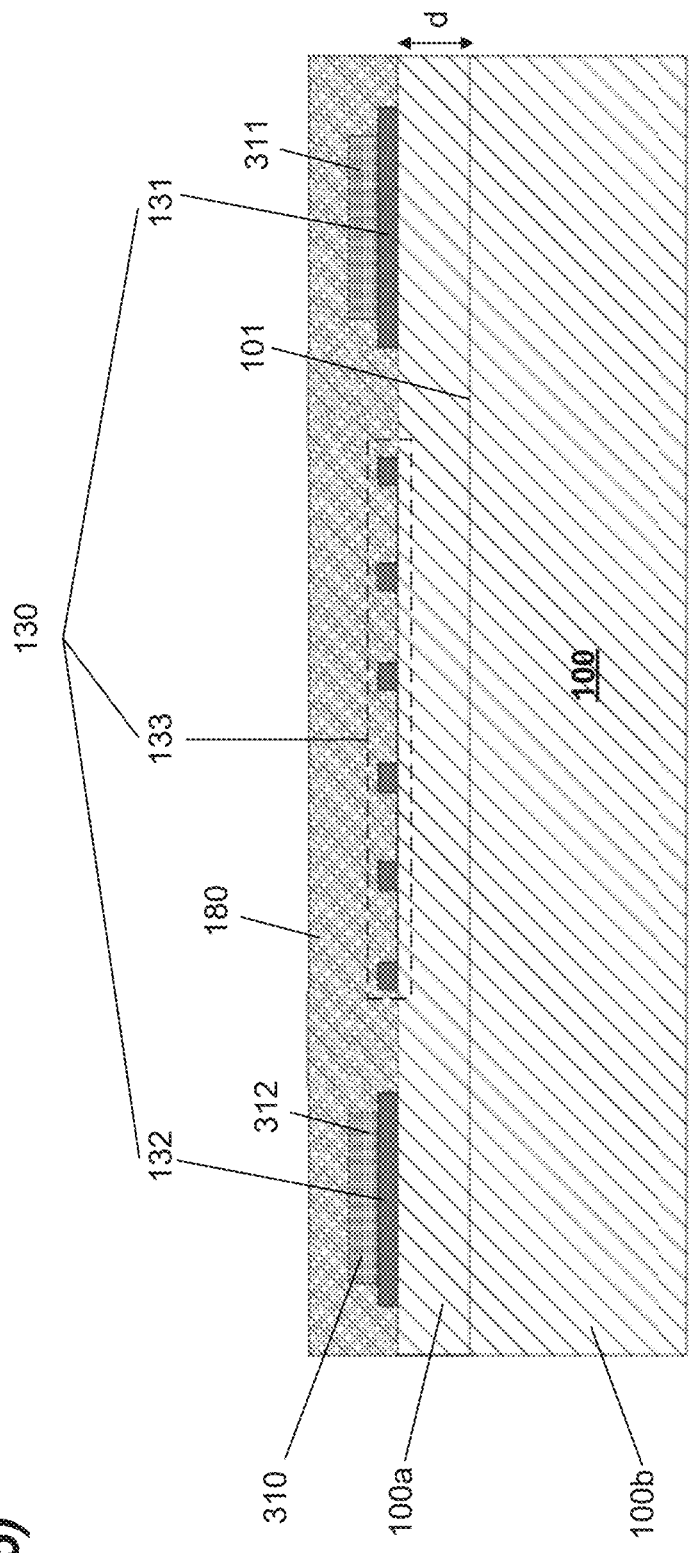

As illustrated in FIG. 7E, in step S5, first dielectric layer 180 is deposited on first portion 100a of piezoelectric substrate 100, covering IDT 130 and first pad metal layer 310. First dielectric layer 180 may include silicon oxide, silicon nitride, or a stacked combination of these materials. First dielectric layer 180 may by deposited by using a physical vapor deposition (PVD) process or a low temperature chemical vapor deposition (CVD) process.

Figure 7F:
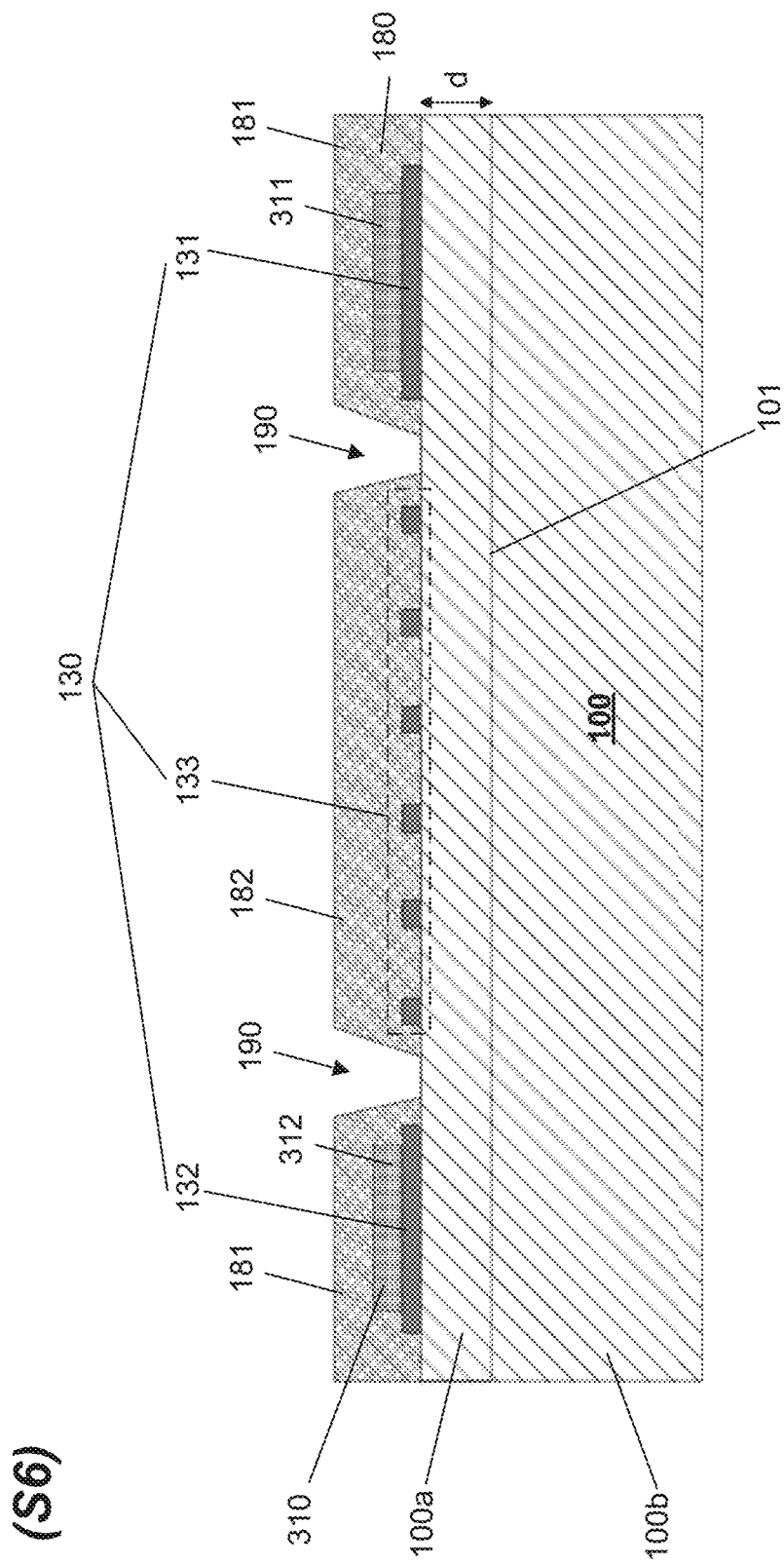

As illustrated in FIG. 7F, in step S6, first dielectric layer 180 is patterned by etching to form a trench 190 that exposes a portion of first portion 100a of piezoelectric substrate 100. The patterned first dielectric layer 180 includes a peripheral section 181 and an island section 182 separated from each other by trench 190. Peripheral section 181 surrounds trench 190, which surrounds island section 182. Island section 182 is vertically aligned with interdigital portion 133 of IDT 130. Island section 182 will be removed during a subsequent etching and releasing process, thereby forming cavity 500.

Figure 7G:
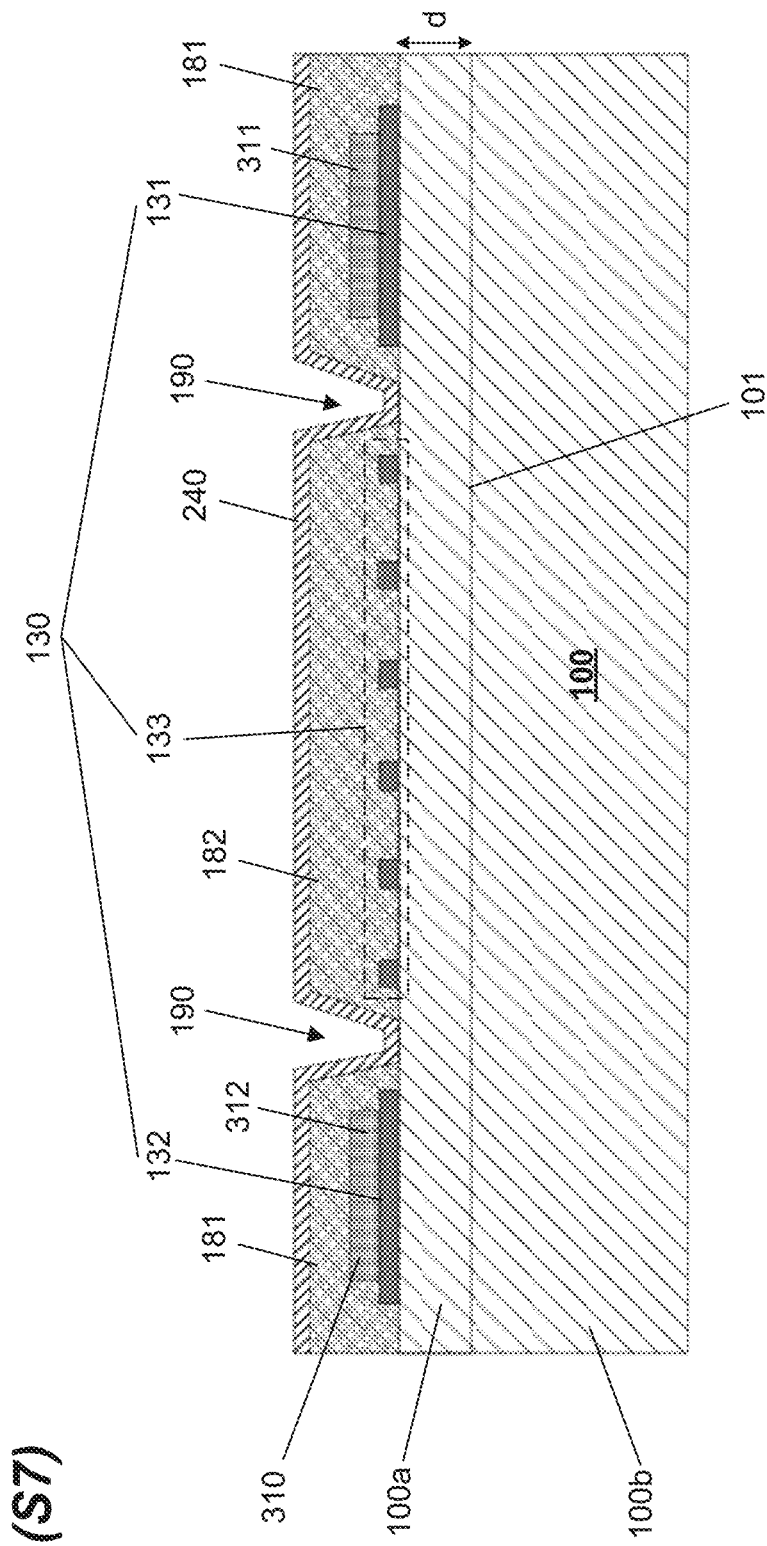

As illustrated in FIG. 7G, in step S7, second dielectric layer 240 is deposited on the structure of FIG. 7F. That is, second dielectric layer 240 is deposited on a top surface of first dielectric layer 180, side surfaces of trench 190, and the portion of first portion 100a of piezoelectric substrate 100 that was exposed by trench 190. As a result, island section 182 of first dielectric layer 180 is enclosed by second dielectric layer 240 and first portion 100a of piezoelectric substrate 100. Therefore, the subsequently formed cavity 500 is enclosed by second dielectric layer 240 and piezoelectric layer 140. Second dielectric layer 240 may be formed of a non-conductive material that cannot be etched by hydrofluoric acid, including, but not limited to, polysilicon, amorphous silicon, AlN, SiN, TaN, GaN, or a stacked combination of two or more of those materials.

Figure 7H:
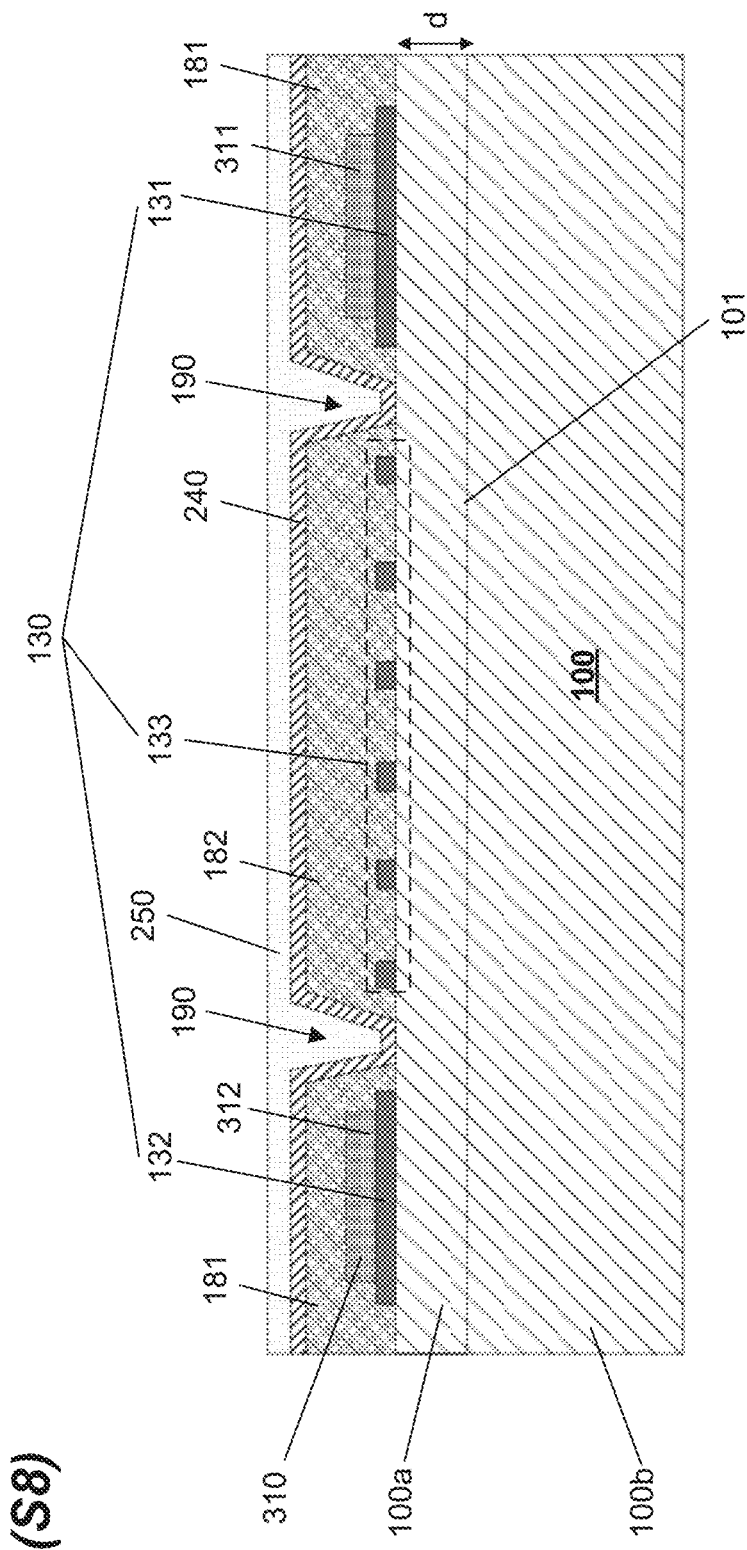

As illustrated in FIG. 7H, in step S8, third dielectric layer 250 is deposited on the structure of FIG. 7F. That is, third dielectric layer 250 is deposited on second dielectric layer 240 and filling in trench 190. The portion of third dielectric layer 250 that fills in trench 190 constitutes protruding structure 251 (FIGS. 5A and 5C) in SAW filter 2000. Then, a top surface of third dielectric layer 250 is polished by, for example, chemical mechanical polishing (CMP) so that the top surface of third dielectric layer 250 is parallel to a major plane of piezoelectric substrate 100. The third dielectric layer may be a non-conductive material such as silicon oxide, silicon nitride, or a stacked combination thereof.

Figure 7I:
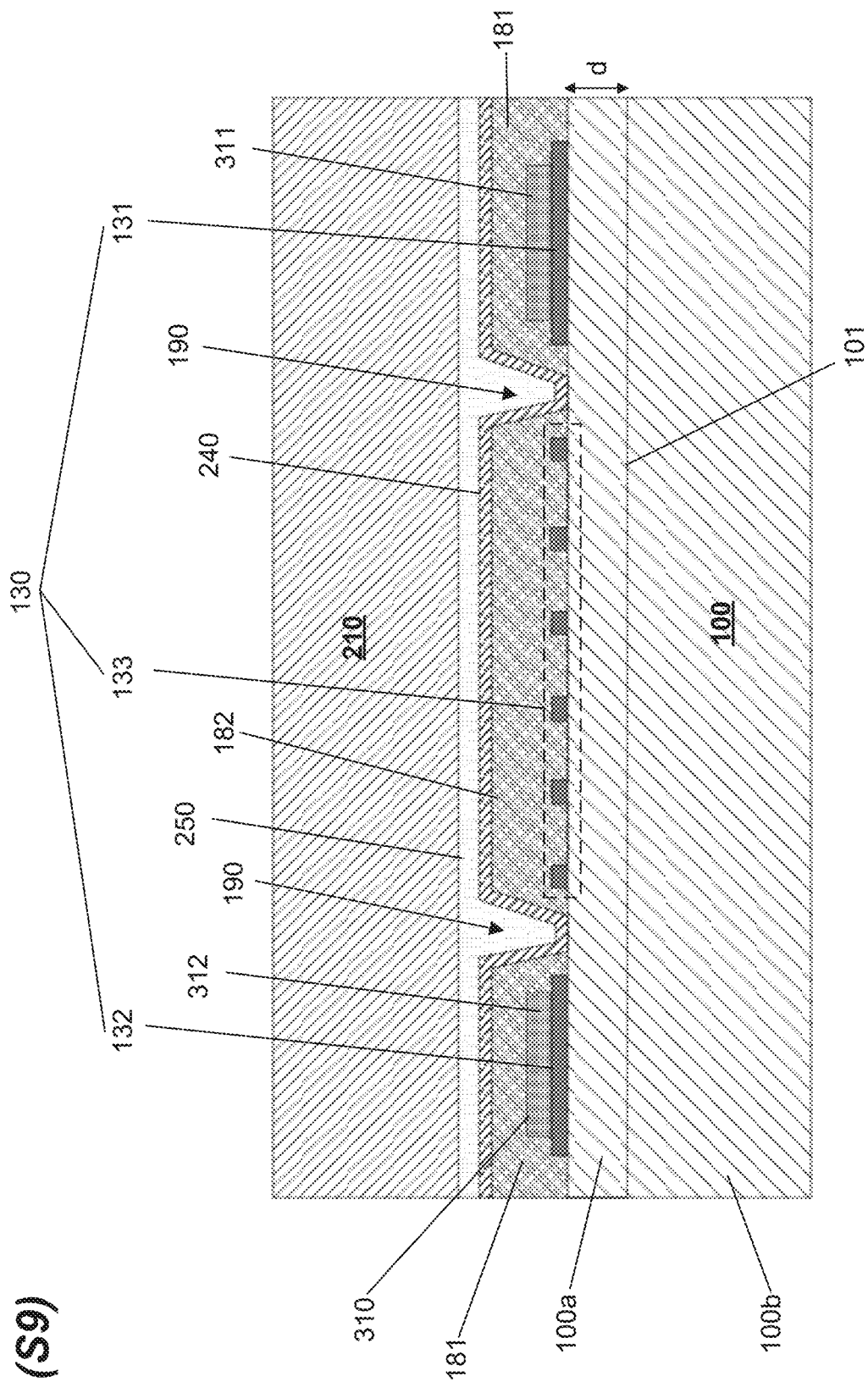

As illustrated in FIG. 7I, in step S9, bottom substrate 210 is bonded to third dielectric layer 180. Bottom substrate 210 may include Si, SiO$_2$, polysilicon, silicon carbide, sapphire (Al$_2$O$_3$), or a stacked combination of two or more of those materials.

Figure 7J:
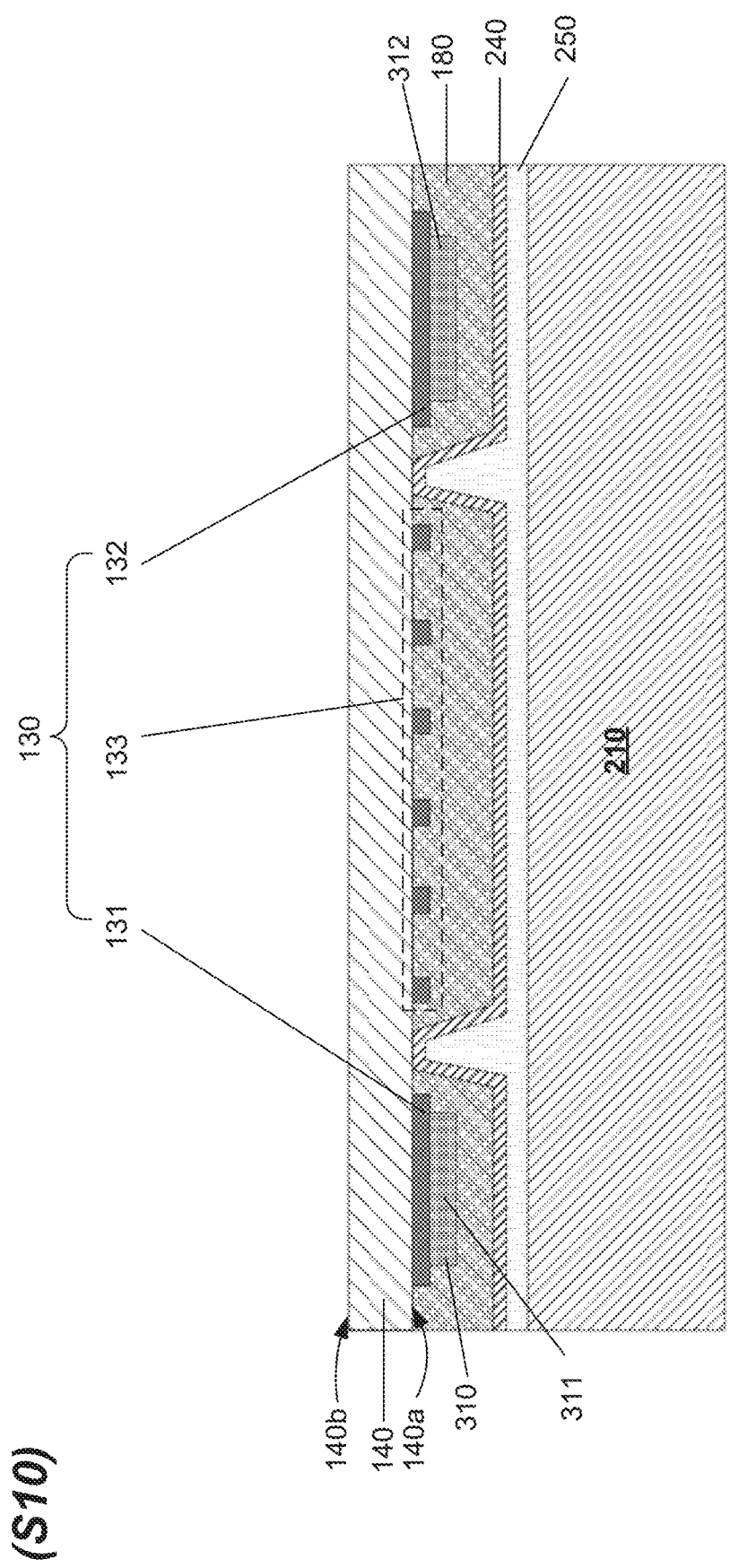

As illustrated in FIG. 7J, in step S10, the structure shown in FIG. 7I is flipped over and a thermal anneal is performed on the structure. The annealing temperature may range from approximately 400° C. to approximately 650° C. As a result of the thermal anneal, ion layer 101 in piezoelectric substrate 100 is broken. Second portion 100b of piezoelectric substrate 100 below ion layer 101 is removed, while first portion 100a of piezoelectric substrate 100 above ion layer 101 remains. First portion 100a of piezoelectric substrate 100 constitutes piezoelectric layer 140 in SAW filter 2000. Piezoelectric layer 140 has bottom surface 140a where IDT 130 is formed, and top surface 140b exposed. A CMP may be performed on the exposed top surface 140b of piezoelectric layer 140 to obtain a smooth surface, and to achieve the desired thickness of piezoelectric layer 140 in SAW filter 2000. In some embodiments, an ion beam etching (IBE) or ion beam milling process may be performed on piezoelectric layer 140 to achieve a more uniform thickness.

Figure 7K:
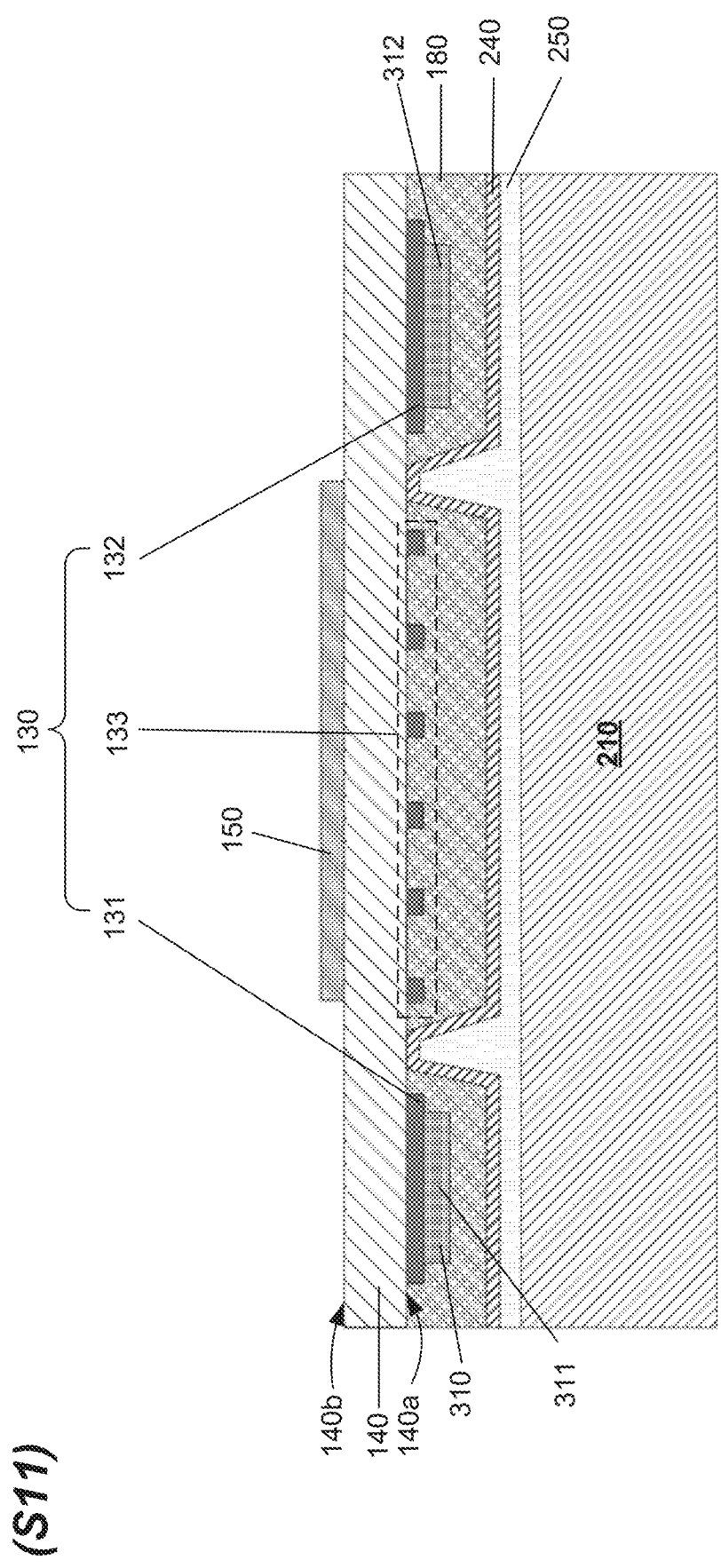

As illustrated in FIG. 7K, in step S11, back electrode 150 is formed on top surface 140b of piezoelectric layer 140. Back electrode 150 may include any suitable conductive material, such as various metal materials with conductive properties or a stack of several conductive metal materials, such as molybdenum (Mo), aluminum (Al), copper (Cu), platinum (Pt), tantalum (Ta), tungsten (W), palladium (Pd), ruthenium (Ru), etc.

Figure 7L:
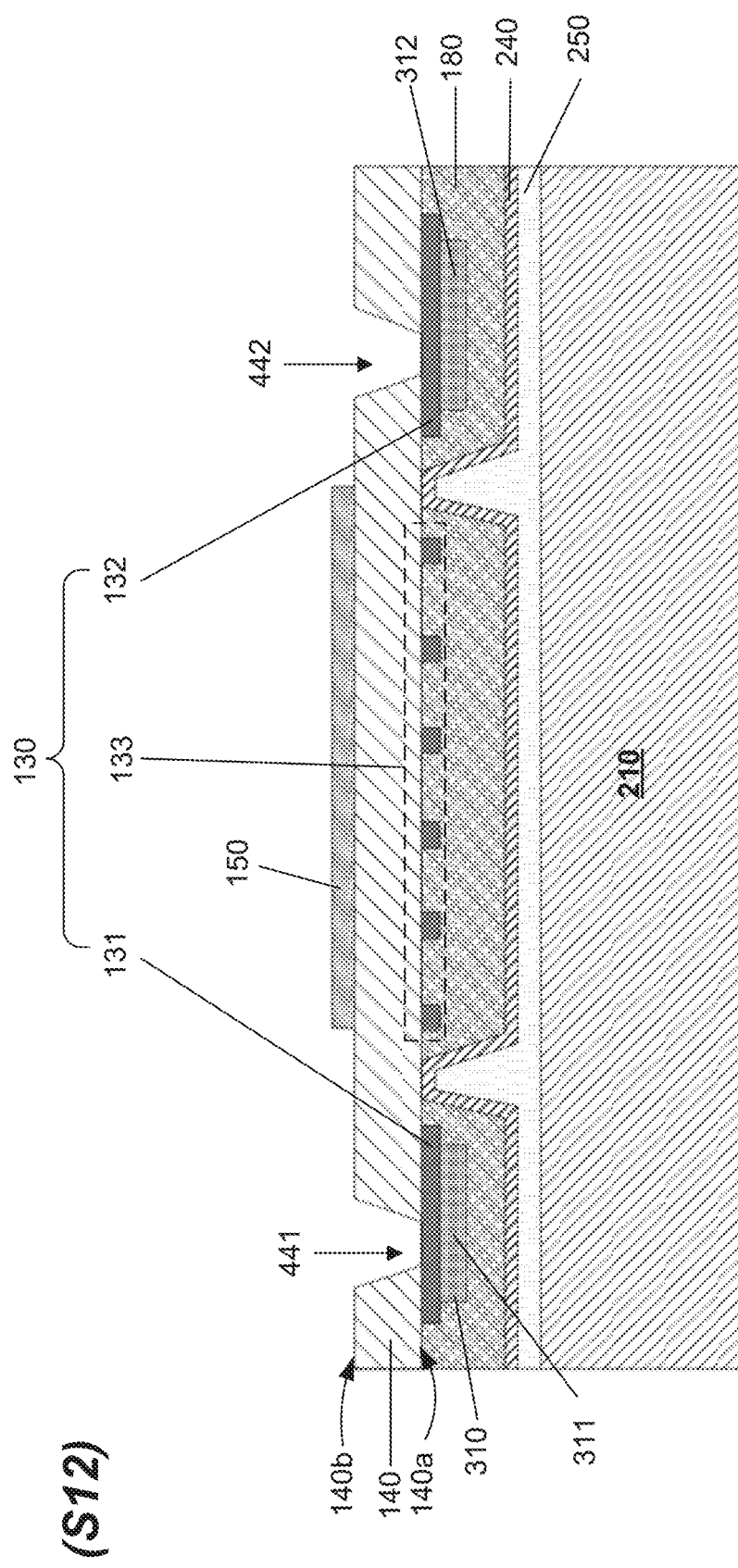

As illustrated in FIG. 7L, in step S12, piezoelectric layer 140 is etched to form a first opening 441 that exposes a portion of first input and output end 131 of IDT 130, and a second opening 442 that exposes a portion of second input and output end 132 of IDT 130. Although not shown in FIG. 7L, a release hole is also formed in piezoelectric layer 140 by etching, to expose a portion of island section 182 of first dielectric layer 180. The release hole is used for forming cavity 500 in the subsequent etching and releasing process.

Figure 7M:
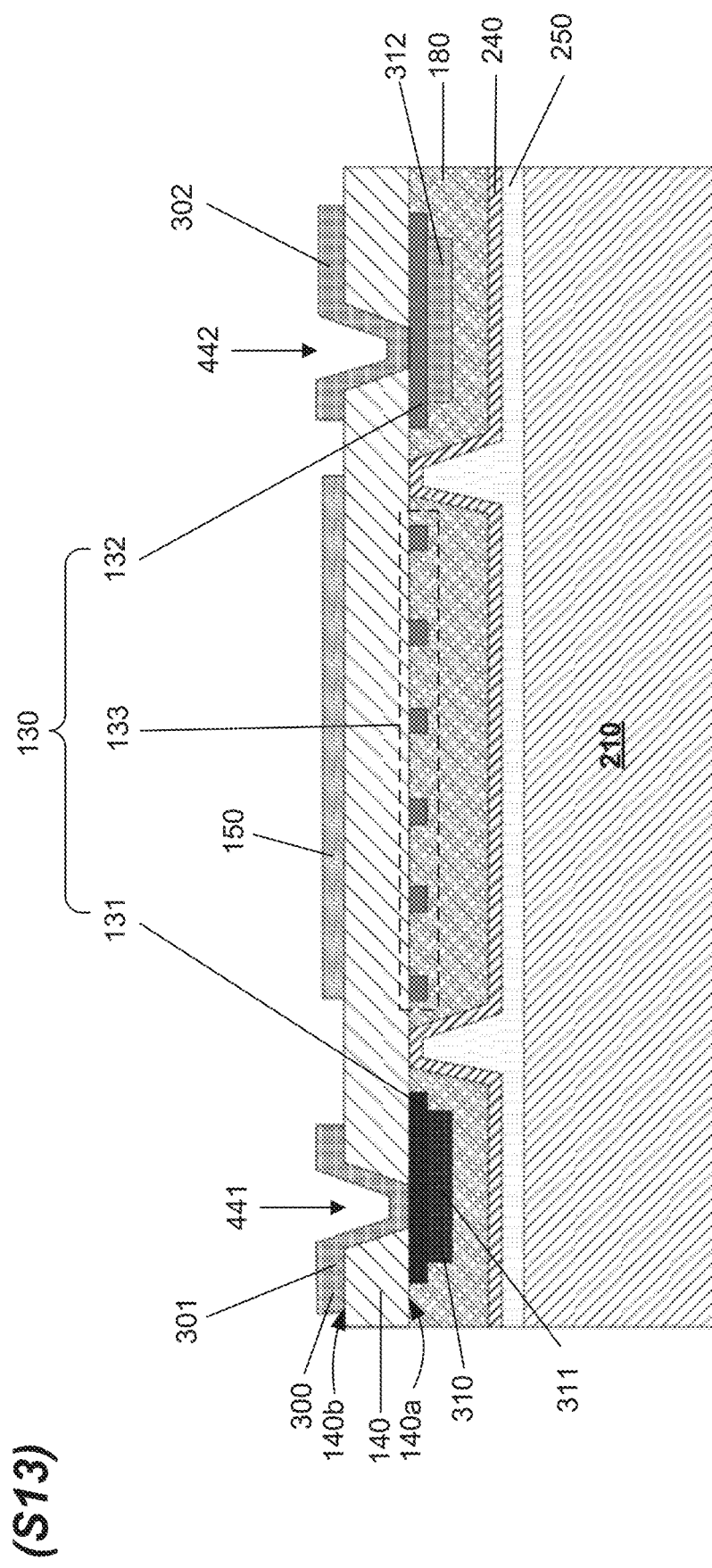
Figure 7N:
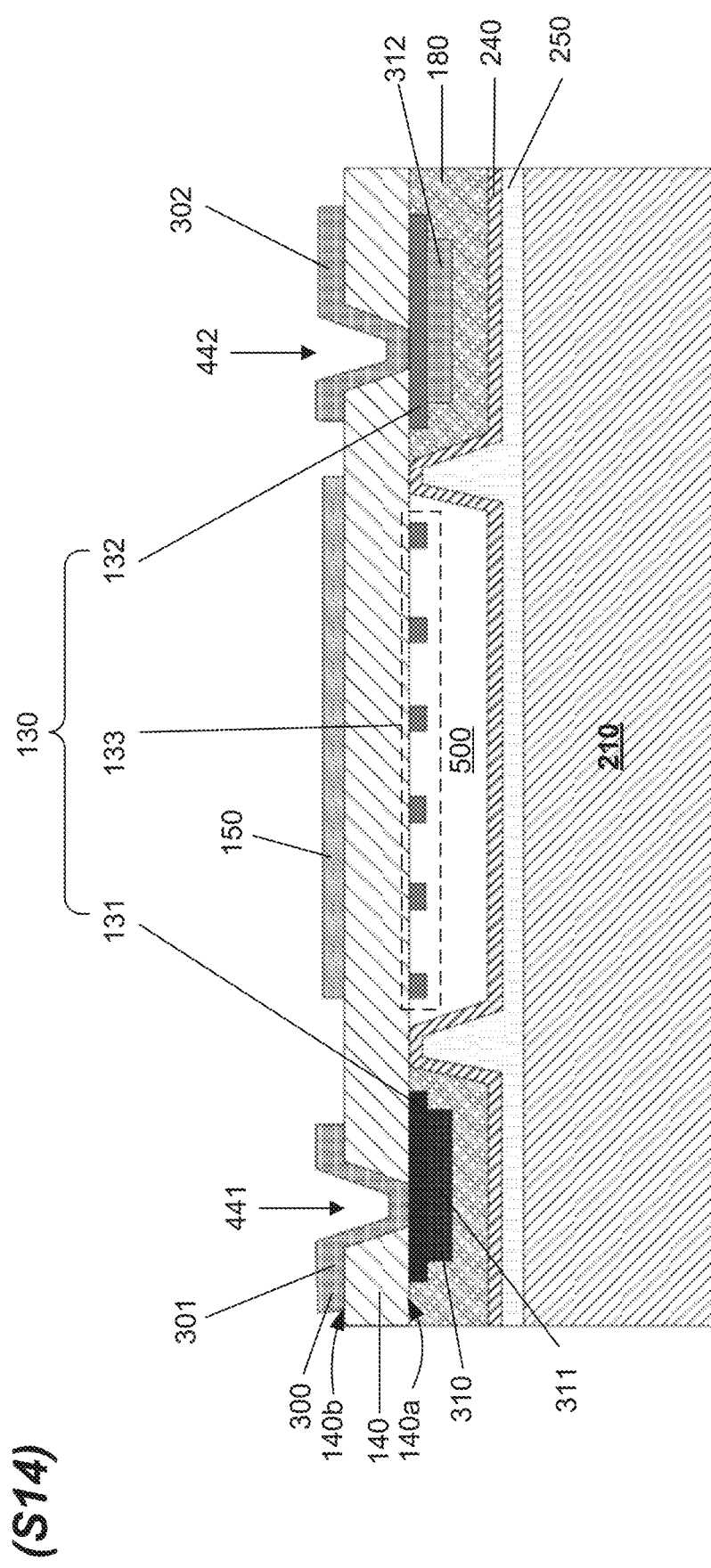

As illustrated in FIG. 7M, in step S13, a second pad metal layer 300 is formed on the structure of FIG. 7L. Then, second pad metal layer 300 is patterned to form first section 301 disposed in first opening 441 and electrically connected to first input and output end 131 of IDT 130 via first opening 441, and second section 302 disposed in second opening 442 and electrically connected to second input and output end 132 of IDT 130 via second opening 442.

As illustrated in FIG. 7N, in step S14, island section 182 of first dielectric layer 180 is etched and released to form cavity 500 below interdigital portion 133 of IDT 130. Island section 182 may be etched by a dry etch process using XeF$_2$ plasma. The etchant and etching products of the etching process may be released through the release hole formed in piezoelectric layer in step S11. Thus, SAW filter 2000 illustrated in FIG. 5A is fabricated.

Figure 8:
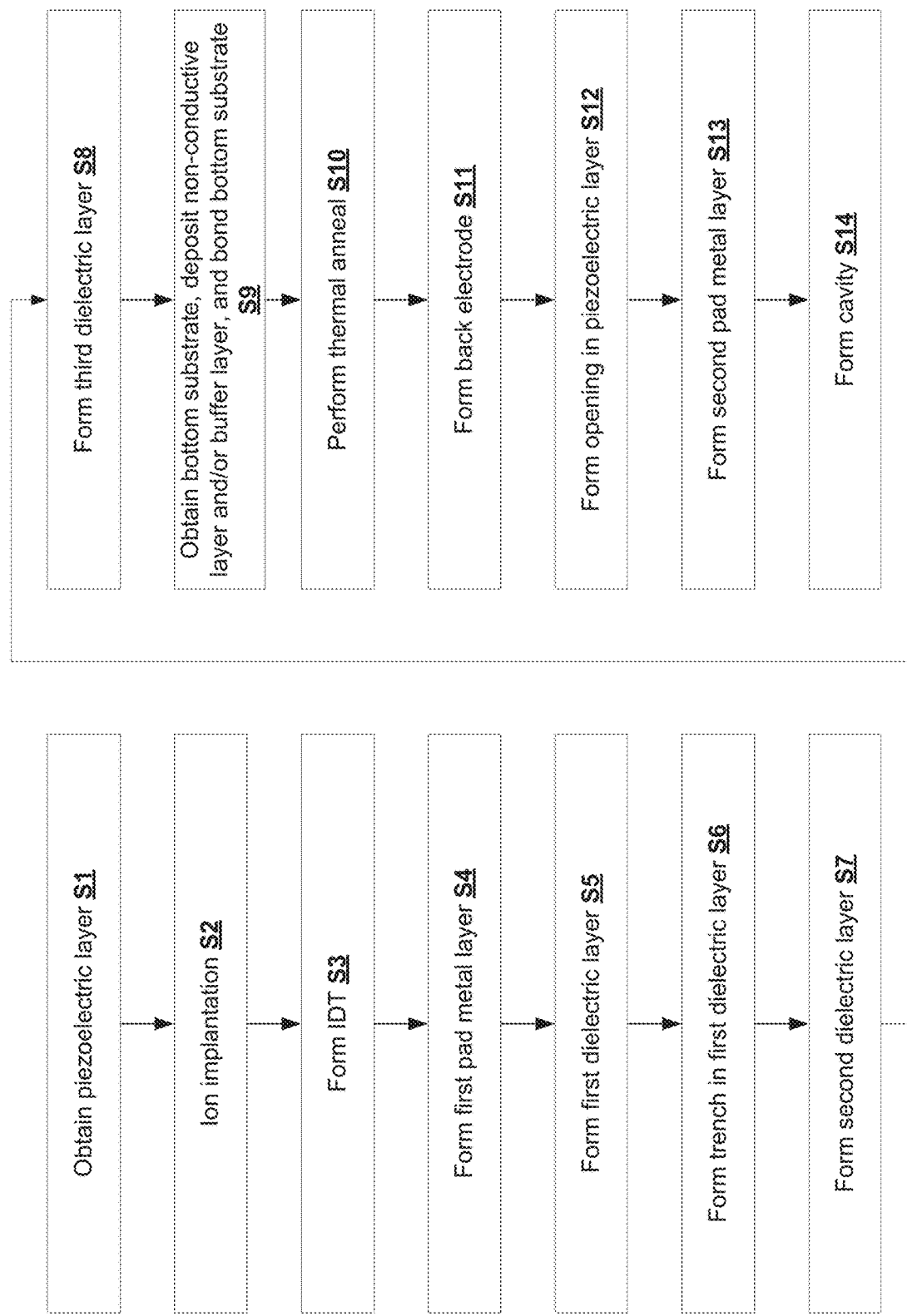
FIG. 8 is a flow chart of a process of fabricating the SAW filter of FIG. 5C, according to an embodiment of the present disclosure.

FIG. 8 is a flow chart of a process of fabricating SAW filter 2001 illustrated FIG. 5C, according to an embodiment of the present disclosure. The process of fabricating SAW filter 2001 as the process of fabricating SAW filter 2000 except that, at step S9, bottom substrate 210 is obtained, at least one of non-conductive layer 320 or buffer layer 330 are deposited on bottom substrate 210, and then bottom substrate 210 deposited with at least one of non-conductive layer 320 or buffer layer 330 is bonded to third dielectric layer 250. When both of non-conductive layer 320 and buffer layer 330 are deposited on bottom substrate 210, non-conductive layer 320 is first deposited on bottom substrate 210, and then buffer layer 330 is deposited on non-conductive layer 320.

Except for step S9, the fabrication process of SAW filter 2001 is the same as that of SAW filter 2000, and therefore detailed descriptions of the other steps of fabricating SAW filter 2001 are not repeated.

In SAW filters 1000, 1001, 2000, and 2001 according to the embodiments of the present disclosure, IDT 130 is provided on one side of piezoelectric layer 140, while back electrode 150 is provided on the opposite side of piezoelectric layer 140. As a result, a higher effective electromechanical coupling coefficient, also referred to as Keff2, of the resonance device can be obtained.

Other embodiments of the disclosure will be apparent to those skilled in the art from consideration of the specification and practice of the disclosure disclosed herein. It is intended that the specification and examples be considered as exemplary only, with a true scope and spirit of the invention being indicated by the following claims.

What is claimed is:

1. A fabrication method of a surface acoustic wave (SAW) filter, comprising:
   obtaining a piezoelectric substrate;
   forming a back electrode on a first portion of the piezoelectric substrate;
   forming a first dielectric layer on the first portion of the piezoelectric substrate, covering the back electrode;
   forming a trench in the first dielectric layer and exposing a portion of the back electrode, the trench surrounding a portion of the first dielectric layer;
   forming a second dielectric layer on the first dielectric layer and covering sidewalls and a bottom of the trench;
   forming a third dielectric layer on the second dielectric layer, the third dielectric layer filling in the trench;
   bonding a bottom substrate to the third dielectric layer;
   removing a second portion of the piezoelectric substrate and leaving the first portion of the piezoelectric substrate, the first portion of the piezoelectric substrate constituting a piezoelectric layer;
   forming an interdigital transducer (IDT) on the piezoelectric layer; and
   etching and releasing the portion of the first dielectric layer surrounded by the trench to form a cavity below the back electrode.

2. The method of claim 1, further comprising:
   before forming the back electrode on the first portion of the piezoelectric substrate, implanting ions into the piezoelectric substrate to form an ion layer at a predetermined depth of the piezoelectric substrate, wherein the first portion of the piezoelectric substrate is disposed above the ion layer, and the second portion of the piezoelectric substrate is disposed below the ion layer; and
   after bonding the bottom substrate to the third dielectric layer, performing a thermal anneal to break the ion layer in the piezoelectric substrate, so as to remove the second portion of the piezoelectric substrate.

3. The method of claim 2, further comprising:
   forming an opening in the piezoelectric layer and exposing the back electrode; and
   forming a pad metal layer on the piezoelectric layer, a first section of the pad metal layer being electrically connected to the back electrode via the opening, a second section of the pad metal layer being electrically connected to a first input and output end of the IDT, and a third section of the pad metal layer being electrically connected to a second input and output end of the IDT.

4. The method of claim 1, wherein
   the first dielectric layer is formed of silicon oxide, silicon nitride, or a stacked combination of those materials;
   the second dielectric layer is formed of polysilicon, amorphous silicon, AlN, SiN, TaN, GaN, or a stacked combination of two or more of those materials; and
   the third dielectric layer is formed of silicon oxide, silicon nitride, or a stacked combination of those materials.

5. The method of claim 1, wherein the piezoelectric substrate is a lithium niobate or lithium tantalate single crystal substrate.

6. The method of claim 1, further comprising, before bonding the bottom substrate to the third dielectric layer:
   forming a non-conductive layer on the bottom substrate.

7. The method of claim 1, further comprising, before bonding the bottom substrate to the third dielectric layer:
   forming a buffer layer on the bottom substrate.

8. The method of claim 1, further comprising, before bonding the bottom substrate to the third dielectric layer:
   forming a non-conductive layer on the bottom substrate; and
   forming a buffer layer on the non-conductive layer.

9. The method of claim 1, wherein the bottom substrate is formed of Si, $SiO_2$, polysilicon, silicon carbide, sapphire ($Al_2O_3$), or a stacked combination of two or more of those materials.

10. A fabrication method of a surface acoustic wave (SAW) filter, comprising:
    obtaining a piezoelectric substrate;
    forming an interdigital transducer (IDT) on a first portion of the piezoelectric substrate;
    forming a first dielectric layer on the first portion of the piezoelectric substrate, covering the IDT;
    forming a trench in the first dielectric layer and exposing a portion of the first portion of the piezoelectric substrate, the trench surrounding a portion of the first dielectric layer that covers an interdigital portion of the IDT;
    forming a second dielectric layer on the first dielectric layer and covering sidewalls and a bottom of the trench;
    forming a third dielectric layer on the second dielectric layer, the third dielectric layer filling in the trench;
    bonding a bottom substrate to the third dielectric layer;
    removing a second portion of the piezoelectric substrate and leaving the first portion of the piezoelectric substrate, the first portion of the piezoelectric substrate constituting a piezoelectric layer;
    forming a back electrode on the piezoelectric layer; and
    etching and releasing the portion of the first dielectric layer surrounded by the trench to form a cavity below the interdigital portion of the IDT.

11. The method of claim 10, further comprising:
    before forming the IDT on the first portion of the piezoelectric substrate, implanting ions into the piezoelectric substrate to form an ion layer at a predetermined depth of the piezoelectric substrate, wherein the first portion of the piezoelectric substrate is disposed above the ion layer, and the second portion of the piezoelectric substrate is disposed below the ion layer;
    after bonding the bottom substrate to the third dielectric layer, performing a thermal anneal to break the ion layer in the piezoelectric substrate, so as to remove the second portion of the piezoelectric substrate.

12. The method of claim 11, further comprising:
    forming a first opening in the piezoelectric layer and exposing the first input and output end of the IDT, and a second opening in the piezoelectric layer and exposing the second input and output end of the IDT; and
    forming a pad metal layer on the piezoelectric layer, a first section of the pad metal layer being electrically connected to the first input and output end of the IDT via the first opening, and a second section of the pad metal layer being electrically connected to the second input and output end of the IDT via the second opening.

13. The method of claim 10, wherein
the first dielectric layer is formed of silicon oxide, silicon nitride, or a stacked combination of those materials;
the second dielectric layer is formed of polysilicon, amorphous silicon, AlN, SiN, TaN, GaN, or a stacked combination of two or more of those materials; and
the third dielectric layer is formed of silicon oxide, silicon nitride, or a stacked combination of those materials.

14. The method of claim 10, wherein the piezoelectric substrate is a lithium niobate or lithium tantalate single crystal substrate.

15. The method of claim 10, further comprising, before bonding the bottom substrate to the third dielectric layer:
forming a non-conductive layer on the bottom substrate.

16. The method of claim 10, further comprising, before bonding the bottom substrate to the third dielectric layer:
forming a buffer layer on the bottom substrate.

17. The method of claim 10, further comprising, before bonding the bottom substrate to the third dielectric layer:
forming a non-conductive layer on the bottom substrate; and
forming a buffer layer on the non-conductive layer.

18. The method of claim 10, wherein the bottom substrate is formed of Si, $SiO_2$, polysilicon, silicon carbide, sapphire ($Al_2O_3$), or a stacked combination of two or more of those materials.

* * * * *